(12) United States Patent
Kasztelan et al.

(10) Patent No.: US 11,641,779 B2
(45) Date of Patent: May 2, 2023

(54) THERMOELECTRIC DEVICES AND METHODS FOR FORMING THERMOELECTRIC DEVICES

(71) Applicant: Infineon Technologies AG, Neubiberg (DE)

(72) Inventors: Christian Kasztelan, Munich (DE); Alexander Breymesser, Villach (AT); Manfred Mengel, Bad Abbach (DE); Andreas Niederhofer, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/208,495

(22) Filed: Mar. 22, 2021

(65) Prior Publication Data

US 2021/0210669 A1 Jul. 8, 2021

Related U.S. Application Data

(62) Division of application No. 16/177,805, filed on Nov. 1, 2018, now abandoned.

(30) Foreign Application Priority Data

Nov. 2, 2017 (DE) .......................... 102017125647.4

(51) Int. Cl.
*H01L 35/34* (2006.01)
*H01L 35/32* (2006.01)
(Continued)

(52) U.S. Cl.
CPC .............. *H01L 35/34* (2013.01); *H01L 35/16* (2013.01); *H01L 35/22* (2013.01); *H01L 35/32* (2013.01)

(58) Field of Classification Search
CPC ......... H01L 35/16; H01L 35/22; H01L 35/32; H01L 35/34
See application file for complete search history.

(56) References Cited

U.S. PATENT DOCUMENTS

| 3,400,452 A | 9/1968 | Frank |
| 3,804,676 A | 4/1974 | Sell |

(Continued)

FOREIGN PATENT DOCUMENTS

| CN | 102810626 A | 12/2012 |
| DE | 209545 A1 | 5/1984 |

(Continued)

*Primary Examiner* — Tamir Ayad
(74) *Attorney, Agent, or Firm* — Murphy, Bilak & Homiller, PLLC

(57) ABSTRACT

A method includes forming a plurality of first semiconductor mesa structures at a first semiconductor substrate. The first semiconductor substrate has a first conductivity type. The method further includes forming a plurality of second semiconductor mesa structures at a second semiconductor substrate. The second semiconductor substrate has a second conductivity type. The method further includes providing a glass substrate between the first semiconductor substrate and the second semiconductor substrate. The method includes connecting the first semiconductor substrate to the second semiconductor substrate so that at least a portion of the glass substrate is located laterally between the first semiconductor mesa structures of the plurality of first semiconductor mesa structures and the second semiconductor mesa structures of the plurality of second semiconductor mesa structures.

8 Claims, 18 Drawing Sheets

(51) Int. Cl.
*H01L 35/22* (2006.01)
*H01L 35/16* (2006.01)

(56) References Cited

U.S. PATENT DOCUMENTS

| | | |
|---|---|---|
| 6,329,217 B1 | 12/2001 | Watanabe et al. |
| 2001/0001960 A1 | 5/2001 | Hiraishi et al. |
| 2005/0139249 A1 | 6/2005 | Ueki et al. |
| 2007/0221264 A1 | 9/2007 | Shutoh et al. |
| 2011/0114146 A1 | 5/2011 | Scullin |
| 2012/0211044 A1* | 8/2012 | Kurihara ................. H01L 35/16 |
| | | 136/220 |
| 2013/0255740 A1 | 10/2013 | Delaizir et al. |
| 2015/0214461 A1 | 7/2015 | Kurihara et al. |
| 2015/0280098 A1* | 10/2015 | Sakai ...................... H01L 35/34 |
| | | 438/54 |
| 2015/0357543 A1 | 12/2015 | Yabuuchi et al. |
| 2016/0286686 A1 | 9/2016 | Gambino et al. |

FOREIGN PATENT DOCUMENTS

| | | |
|---|---|---|
| EP | 0930658 A1 | 7/1999 |
| JP | H118416 A | 1/1999 |
| JP | 2000188429 A | 7/2000 |
| WO | 0019548 A1 | 4/2000 |
| WO | 2009156385 A2 | 12/2009 |

\* cited by examiner

THERMOELECTRIC DEVICES AND METHODS FOR FORMING THERMOELECTRIC DEVICES

RELATED APPLICATIONS

The instant application is a divisional of and claims priority to U.S. application Ser. No. 16/177,805 filed on Nov. 1, 2018, which in turn claims priority to German Patent Application 102017125647.4 filed Nov. 2, 2017, the content of each application being incorporated by reference herein in their entirety.

TECHNICAL FIELD

Examples relate to concepts for semiconductor based thermoelectric devices and in particular to thermoelectric devices and methods for forming thermoelectric devices.

BACKGROUND

A thermoelectric device may be used for converting a temperature difference to an electric voltage and vice versa. The thermoelectric device may create the electric voltage, when sides of the thermoelectric device are at different temperatures. Conversely, a temperature difference between the sides of the thermoelectric device may be generated, when an electric voltage is applied to the thermoelectric device. Thermoelectric devices may be optimized for high conversion efficiency and/or low manufacturing costs.

SUMMARY

There may be a demand to provide improved concepts for thermoelectric devices.

Some embodiments relate to a thermoelectric device. The thermoelectric device comprises a plurality of first semiconductor mesa structures having a first conductivity type. Additionally, the thermoelectric device comprises a plurality of second semiconductor mesa structures having a second conductivity type. The first semiconductor mesa structures of the plurality of first semiconductor mesa structures and the second semiconductor mesa structures of the plurality of second semiconductor mesa structures are electrically connected in series. The thermoelectric device further comprises a glass structure located laterally between the first semiconductor mesa structures of the plurality of first semiconductor mesa structures and the second semiconductor mesa structures of the plurality of second semiconductor mesa structures. The glass structure electrically insulates the first semiconductor mesa structures of the plurality of first semiconductor mesa structures laterally from the second semiconductor mesa structures of the plurality of second semiconductor mesa structures.

Some embodiments relate to a thermoelectric device. The thermoelectric device comprises a plurality of first semiconductor mesa structures having a first conductivity type. Additionally, the thermoelectric device comprises a plurality of second semiconductor mesa structures having a second conductivity type. Second semiconductor mesa structures of the plurality of second semiconductor mesa structures and first semiconductor mesa structures of the plurality of first semiconductor mesa structures are arranged alternating in at least a first lateral direction. Further, a first lateral distance between two first semiconductor mesa structures of the plurality of first semiconductor mesa structures located closest in the first lateral direction differs from a second lateral distance between two first semiconductor mesa structures of the plurality of first semiconductor mesa structures located closest in a second lateral direction by more than 10% of the first lateral distance.

Some embodiments relate to a method for forming a thermoelectric device. The method comprises forming a plurality of first semiconductor mesa structures at a first semiconductor substrate. The first semiconductor substrate has a first conductivity type. Additionally, the method comprises forming a plurality of second semiconductor mesa structures at a second semiconductor substrate. The second semiconductor substrate has a second conductivity type. The method further comprises providing a glass substrate between the first semiconductor substrate and the second semiconductor substrate. Additionally, the method comprises connecting the first semiconductor substrate to the second semiconductor substrate so that at least a portion of the glass substrate is located laterally between the first semiconductor mesa structures of the plurality of first semiconductor mesa structures and the second semiconductor mesa structures of the plurality of second semiconductor mesa structures.

Some embodiments relate to a method for forming a thermoelectric device. The method comprises forming a plurality of first trenches extending into a first semiconductor substrate. The first trenches of the plurality of first trenches extend along a first lateral direction. Further, the first semiconductor substrate has a first conductivity type. Additionally, the method comprises forming a plurality of second trenches extending into the first semiconductor substrate. The second trenches of the plurality of second trenches extend along a second lateral direction to form a plurality of first semiconductor mesa structures at the first semiconductor substrate. The method further comprises forming a plurality of third trenches extending into a second semiconductor substrate. The third trenches of the plurality of third trenches extend along a third lateral direction. Additionally, the second semiconductor substrate has a second conductivity type. Further, the method comprises forming a plurality of fourth trenches extending into the second semiconductor substrate. The fourth trenches of the plurality of fourth trenches extend along a fourth lateral direction to form a plurality of second semiconductor mesa structures at the second semiconductor substrate. The method additionally comprises connecting the first semiconductor substrate to the second semiconductor substrate.

BRIEF DESCRIPTION OF THE FIGURES

Some examples of apparatuses and/or methods will be described in the following by way of example only, and with reference to the accompanying figures, in which.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B. An alternative wording for the same combinations is "at least one of A and B". The same applies for combinations of more than 2 elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Figure 1:
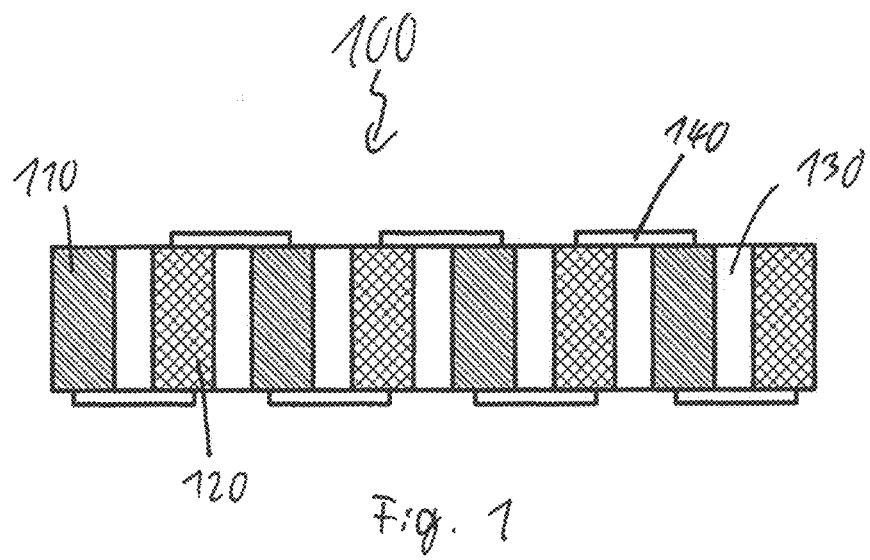
FIG. 1 shows a schematic cross section of a part of a thermoelectric device.

FIG. 1 shows a schematic cross section of a part of a thermoelectric device 100. The thermoelectric device 100 comprises a plurality of first semiconductor mesa structures 110 having a first conductivity type. Additionally, the thermoelectric device 100 comprises a plurality of second semiconductor mesa structures 120 having a second conductivity type. The first semiconductor mesa structures 110 of the plurality of first semiconductor mesa structures 110 and the second semiconductor mesa structures 120 of the plurality of second semiconductor mesa structures 120 are electrically connected in series. The thermoelectric device 100 further comprises a glass structure 130 located laterally between the first semiconductor mesa structures 110 of the plurality of first semiconductor mesa structures 110 and the second semiconductor mesa structures 120 of the plurality of second semiconductor mesa structures 120. The glass structure 130 electrically insulates the first semiconductor mesa structures 110 of the plurality of first semiconductor mesa structures 110 laterally from the second semiconductor mesa structures 120 of the plurality of second semiconductor mesa structures 120.

By locating the glass structure 130 laterally between the first semiconductor mesa structures 110 of the plurality of first semiconductor mesa structures 110 and the second semiconductor mesa structures 120 of the plurality of second semiconductor mesa structures 120 the first semiconductor mesa structures 110 of the plurality of first semiconductor mesa structures 110 may be strongly connected with the second semiconductor mesa structures 120 of the plurality of second semiconductor mesa structures 120. Therefore, a mechanical robustness of the thermoelectric device 100 may be increased. Additionally, since glasses typically have comparatively high melting points and small thermal expansion coefficients (e.g. compared to plastics), the thermoelectric device 100 may resist higher temperatures and/or higher temperature differences between different sides of the thermoelectric device 100. Therefore, a life time of the thermoelectric device 100 may be increased. Further, due to the low electrical conductivity of glasses, a high lateral electrical insulation of the first semiconductor mesa structures 110 of the plurality of first semiconductor mesa structures 110 laterally from the second semiconductor mesa structures 120 of the plurality of second semiconductor mesa structures 120 may be provided. Therefore, a lateral distance between neighboring first semiconductor mesa structures 110 of the plurality of first semiconductor mesa structures 110 and second semiconductor mesa structures 120 of the plurality of second semiconductor mesa structures 120 may be reduced. In this way, a number of first semiconductor mesa structures 110 per lateral unit area and a number of second semiconductor mesa structures 120 per lateral unit area of the thermoelectric device 100 may be increased. Therefore, an efficiency of the thermoelectric device 100 for converting a temperature difference to an electric voltage or vice versa may be increased.

For example, the glass structure 130 may fill more than 90% (or more than 95% or more than 99%) of a lateral space between the first semiconductor mesa structures 110 of the plurality of first semiconductor mesa structures 110 and the second semiconductor mesa structures 120 of the plurality of second semiconductor mesa structures 120. The glass structure 130 may fill the total lateral space between the first semiconductor mesa structures 110 of the plurality of first semiconductor mesa structures 110 and the second semiconductor mesa structures 120 of the plurality of second semiconductor mesa structures 120, for example. For example, the glass structure 130 may electrically insulate the first semiconductor mesa structures 110 of the plurality of first semiconductor mesa structures 110 laterally from each other. The glass structure 130 may electrically insulate the second semiconductor mesa structures 120 of the plurality of second semiconductor mesa structures 120 laterally from one another, for example.

For example, a thermal expansion coefficient of the glass structure 130 may be greater than 50% (or greater than 75%, greater than 80% or greater than 90%) and/or less than 200% (or less than 175%, less than 150%, less than 125% or less than 110%) of a thermal expansion coefficient of the first semiconductor mesa structures 110 of the plurality of first semiconductor mesa structures 110.

For example, a thermal expansion coefficient of the glass structure 130 may be greater than 50% (or greater than 75%, greater than 80% or greater than 90%) and/or less than 200% (or less than 175%, less than 150%, less than 125% or less than 110%) of a thermal expansion coefficient of the second semiconductor mesa structures 120 of the plurality of second semiconductor mesa structures 120. In this way, a thermal expansion of the glass structure 130 may be similar to a respective thermal expansion of the first semiconductor mesa structures 112 and/or the second semiconductor mesa structures 120. By this, a mechanical stress of the thermoelectric device 100 during an operation of the thermoelectric device 100 may be reduced. Therefore, a more robust thermoelectric device 100 may be provided. For example, the thermal expansion coefficient of the first semiconductor mesa structures 110 of the plurality of first semiconductor mesa structures 110 may differ from the thermal expansion coefficient of the second semiconductor mesa structures 120 of the plurality of second semiconductor mesa structures 120 by less than 25% (or less than 10%, less than 5% or less than 1%) of the thermal expansion coefficient of the first semiconductor mesa structures 110 of the plurality of first semiconductor mesa structures 110.

For example, the glass structure 130 may comprise at least one of a borosilicate glass, boron-zinc-glass and a low transition temperature glass. For example, the glass substrate comprises or consist of glass material with a coefficient of thermal expansion CTE larger than $2*10^{-6}$ $K^{-1}$ and/or less than $17*10^{-6}$ $K^{-1}$. For example, borosilicate glass comprises a CTE of $3.25*10^{-6}$ $K^{-1}$ and low transition temperature Tg glass comprises a CTE close to $17*10^{-6}$ $K^{-1}$. Low transition temperature Tg glass often has a high CTE while using glass with higher transition temperature may require a more complex temperature control. For example, a borosilicate glass comprising Si—O2, Al—O3, B2-O3, Na2-O and K2-O may be used. The glass pressing process may be done at a transformation temperature representing a point in the viscosity curve between the transition temperature Tg (glass point) and the softening point with Tg<softening point $10^{7.6}$ dPa sec. Low transition temperature Tg glass may be a good material for precision glass molding. Boron-zinc-glass may have good semiconductor insulation properties and a good CTE and process temperature.

The glass structure 130 may comprise a material so that the thermal expansion coefficient of the glass structure 130 may be similar to the thermal expansion coefficient of the first semiconductor mesa structures 110 of the plurality of first semiconductor mesa structures 110 and/or to the thermal expansion coefficient of the second semiconductor mesa structures 120 of the plurality of second semiconductor mesa structures 120. By this, a mechanical stress of the thermoelectric device 100 during an operation of the thermoelectric device 100 may be reduced. Therefore, a more robust thermoelectric device 100 may be provided. For example, the low transition temperature glass may be a Low Tg glass or an optical material for precision molding.

For example, the thermoelectric device 100 may further comprise a plurality of metallization structures 140 located at a first side of the first semiconductor mesa structures 110 of the plurality of first semiconductor mesa structures 110 and the second semiconductor mesa structures 120 of the plurality of second semiconductor mesa structures 120. Each metallization structure 140 of the plurality of metallization structures 140 may electrically connect a first semiconductor mesa structure 110 of the plurality of first semiconductor mesa structures 110 and a second semiconductor mesa structure 120 of the plurality of second semiconductor mesa structures 120. In this way, the first semiconductor mesa structures 110 of the plurality of first semiconductor mesa structures 110 and the second semiconductor mesa structures 120 of the plurality of second semiconductor mesa structures 120 may be efficiently electrically connected pairwise. For example, the first side of the of the first semiconductor mesa structures 110 of the plurality of first semiconductor mesa structures 110 and the second semiconductor mesa structures 120 of the plurality of second semiconductor mesa structures 120 may be a side of the thermoelectric device 100, at which respective bases or respective plateaus of the first semiconductor mesa structures 110 of the plurality of first semiconductor mesa structures 110 and the second semiconductor mesa structures 120 of the plurality of second semiconductor mesa structures 120 are located. For example, the metallization structures 140 of the plurality of metallization structures 140 may comprise at least one of aluminum, copper, tungsten, molybdenum, titanium and/or titanium nitride and/or an alloy of aluminum, copper, tungsten, molybdenum and/or titanium, for example titanium-tungsten (TiW).

For example, the thermoelectric device 100 may further comprise a plurality of metallization structures 140 located at a second side of the first semiconductor mesa structures 110 of the plurality of first semiconductor mesa structures 110 and the second semiconductor mesa structures 120 of the plurality of second semiconductor mesa structures 120. Each metallization structure 140 of the plurality of metallization structures 140 may electrically connect a first semiconductor mesa structure 110 of the plurality of first semiconductor mesa structures 110 and (or to) a second semiconductor mesa structure 120 of the plurality of second semiconductor mesa structures 120. In this way, the first semiconductor mesa structures 110 of the plurality of first semiconductor mesa structures 110 and the second semiconductor mesa structures 120 of the plurality of second semiconductor mesa structures 120 may be efficiently electrically connected pairwise. For example, the second side and the first side may be opposite sides of the thermoelectric device 100. The metallization structure 140 of the plurality of metallization structures 140 may electrically connect the first semiconductor mesa structures 110 of the plurality of first semiconductor mesa structures 110 and the second semiconductor mesa structures 120 of the plurality of second semiconductor mesa structures 120 in series and/or in parallel, for example.

For example, the first semiconductor mesa structures 110 of the plurality of first semiconductor mesa structures 110 may have a maximal lateral dimension of more than 25 µm (or more than 50 µm, more than 75 µm or more than 80 µm) and/or less than 250 µm (or less than 200 µm or less than 150 µm). In this way, a power yield of the thermoelectric device 100 may be improved.

For example, the second semiconductor mesa structures 120 of the plurality of second semiconductor mesa structures 120 may have a maximal lateral dimension of more than 25 µm (or more than 50 µm, more than 75 µm or more than 80 µm) and/or less than 250 µm (or less than 200 µm or less than 150 µm). In this way, a power yield of the thermoelectric device 100 may be improved. For example, the first semiconductor mesa structures 110 of the plurality of first semiconductor mesa structures 110 and the second semiconductor mesa structures 120 of the plurality of second semiconductor mesa structures 120 may have the same maximal lateral dimension.

For example, the first semiconductor mesa structures 110 of the plurality of first semiconductor mesa structures 110 may have a vertical dimension of more than 200 µm (or more than 250 µm or more than 300 µm) and/or less than 1 mm (or less than 750 µm or less than 500 µm). In this way, a power yield of the thermoelectric device 100 may be improved. The vertical dimension may be a maximal vertical dimension of the first semiconductor mesa structures 110 of the plurality of first semiconductor mesa structures 110, for example.

For example, the second semiconductor mesa structures 120 of the plurality of second semiconductor mesa structures 120 may have a vertical dimension of more than 200 µm (or more than 250 µm or more than 300 µm) and/or less than 1 mm (or less than 750 µm or less than 500 µm). In this way, a power yield of the thermoelectric device 100 may be improved. The vertical dimension may be a maximal vertical dimension of the second semiconductor mesa structures 120 of the plurality of second semiconductor mesa structures 120, for example. For example, the first semiconductor mesa structures 110 of the plurality of first semiconductor mesa structures 110 and the second semiconductor mesa structures 120 of the plurality of second semiconductor mesa structures 120 may have the same vertical dimension or the same maximal vertical dimension.

For example, the first semiconductor mesa structures 110 of the plurality of first semiconductor mesa structures 110 and/or the second semiconductor mesa structures 120 of the plurality of second semiconductor mesa structures 120 may be strip-shaped, lamella-shaped or column-shaped. For example, a shape of a lateral cross section of the first semiconductor mesa structures 110 of the plurality of first semiconductor mesa structures 110 may be selected from the group of a square, a rectangle, a circle, and an ellipse. A shape of a lateral cross section of the second semiconductor mesa structures 120 of the plurality of second semiconductor mesa structures 120 may be selected from the group of a square, a rectangle, a circle, and an ellipse, for example. For example, corners and/or edges of the first semiconductor mesa structures 110 of the plurality of first semiconductor mesa structures 110 and/or of the second semiconductor mesa structures 120 of the plurality of second semiconductor mesa structures 120 may be rounded.

For example, the first semiconductor mesa structures 110 of the plurality of first semiconductor mesa structures 110 may taper vertically. The second semiconductor mesa structures 120 of the plurality of second semiconductor mesa structures 120 may taper vertically, for example. For example, a width of the first semiconductor mesa structures 110 of the plurality of first semiconductor mesa structures 110 may be less than 90% (or less than 75%, less than 50% or less than 25%) of a length of the first semiconductor mesa structures 110 of the plurality of first semiconductor mesa structures 110. A width of the second semiconductor mesa structures 120 of the plurality of second semiconductor mesa structures 120 may be less than 90% (or less than 75%, less than 50% or less than 25%) of a length of the second semiconductor mesa structures 120 of the plurality of second semiconductor mesa structures 120.

For example, a minimal lateral distance between two first semiconductor mesa structures 110 of the plurality of first semiconductor mesa structures 110 may be less than 150% (or less than 125% or less than 110%) of a maximal lateral dimension of the first semiconductor mesa structures 110 of the plurality of first semiconductor mesa structures 110. In this way, the first semiconductor mesa structures 110 of the plurality of first semiconductor mesa structures 110 may be packed denser within the thermoelectric device 100. By this, a conversion efficiency of the thermoelectric device 100 may be increased.

For example, a minimal lateral distance between two second semiconductor mesa structures 120 of the plurality of second semiconductor mesa structures 120 may be less than 150% (or less than 125% or less than 110%) of a maximal lateral dimension of the second semiconductor mesa structures 120 of the plurality of second semiconductor mesa structures 120. In this way, the second semiconductor mesa structures 120 of the plurality of second semiconductor mesa structures 120 may be packed denser within the thermoelectric device 100. By this, a conversion efficiency of the thermoelectric device 100 may be increased.

For example, a minimal lateral distance between a first semiconductor mesa structure 110 of the plurality of first semiconductor mesa structures 110 and a second semiconductor mesa structure 120 of the plurality of second semiconductor mesa structures 120 may be less than 75% (or less than 50%, less than 25% or less than 10%) of a maximal lateral dimension of the first semiconductor mesa structures 110 of the plurality of first semiconductor mesa structures 110 and/or less than 75% (or less than 50%, less than 25% or less than 10%) of a maximal lateral dimension of the second semiconductor mesa structures 120 of the plurality of second semiconductor mesa structures 120. In this way, the first semiconductor mesa structures 110 of the plurality of first semiconductor mesa structures 110 and the second semiconductor mesa structures 120 of the plurality of second semiconductor mesa structures 120 may be packed denser within the thermoelectric device 100. By this, a conversion efficiency of the thermoelectric device 100 may be increased.

For example, the plurality of first semiconductor mesa structures 110 may comprise more than 5 (or more than 10, more than 50, more than 100, more than 500 or more than 1000) first semiconductor mesa structures 110. The plurality of second semiconductor mesa structures 120 may comprise more than 5 (or more than 10, more than 50, more than 100, more than 500 or more than 1000) second semiconductor mesa structures 120, for example. For example, the first semiconductor mesa structures 110 of the plurality of first semiconductor mesa structures 110 and the second semiconductor mesa structures 120 of the plurality of second semiconductor mesa structures 120 may be distributed over the whole lateral area of the thermoelectric device 100. For example, the thermoelectric device 100 may have a lateral dimension of more than 500 µm (or more than 1 mm, more than 2.5 mm, more than 5 mm or more than 10 mm). One first semiconductor mesa structures 110 of the plurality of first semiconductor mesa structures 110 and one neighboring second semiconductor mesa structures 120 of the plurality of second semiconductor mesa structures 120 may form a thermocell, a micro-generator cell, thermoelement or a thermoelectric unit, for example.

For example, the thermoelectric device 100 may be a thermoelectric generator, a Seebeck generator, a microgenerator, a thermoelectric cooler, a thermoelectric heater, a Peltier device, a Peltier cooler, a Peltier heater, a thermoelectric heat pump, or a solid state refrigerator.

For example, the first side and the second side of the thermoelectric device 100 may be at different temperatures and an electric voltage may be generated in line with the Seebeck effect, since the first semiconductor mesa structures 110 of the plurality of first semiconductor mesa structures 110 and the second semiconductor mesa structures 120 of the plurality of second semiconductor mesa structures 120 have different conductivity types. The generated electric voltage may be used to power a sensor, an actor or a wireless device, for example.

For example, the first semiconductor mesa structures 110 of the plurality of first semiconductor mesa structures 110 and/or the second semiconductor mesa structures 120 of the plurality of second semiconductor mesa structures 120 may comprise at least one of silicon (Si), germanium (Ge), silicon-germanium (SiGe), and bismuth telluride ($Bi_2Te_3$). For example, a semiconductor mesa structure having the first conductivity type may be an n-doped semiconductor mesa structure (e.g. caused by incorporating nitrogen ions, phosphor ions or arsenic ions) or a p-doped semiconductor mesa structure (e.g. caused by incorporating aluminum ions or boron ions). Consequently, the second conductivity type indicates an opposite p-doped semiconductor mesa structure or n-doped semiconductor mesa structure. In other words, the first conductivity type may indicate a p-doping and the second conductivity type may indicate an n-doping or vice-versa.

Figure 2:
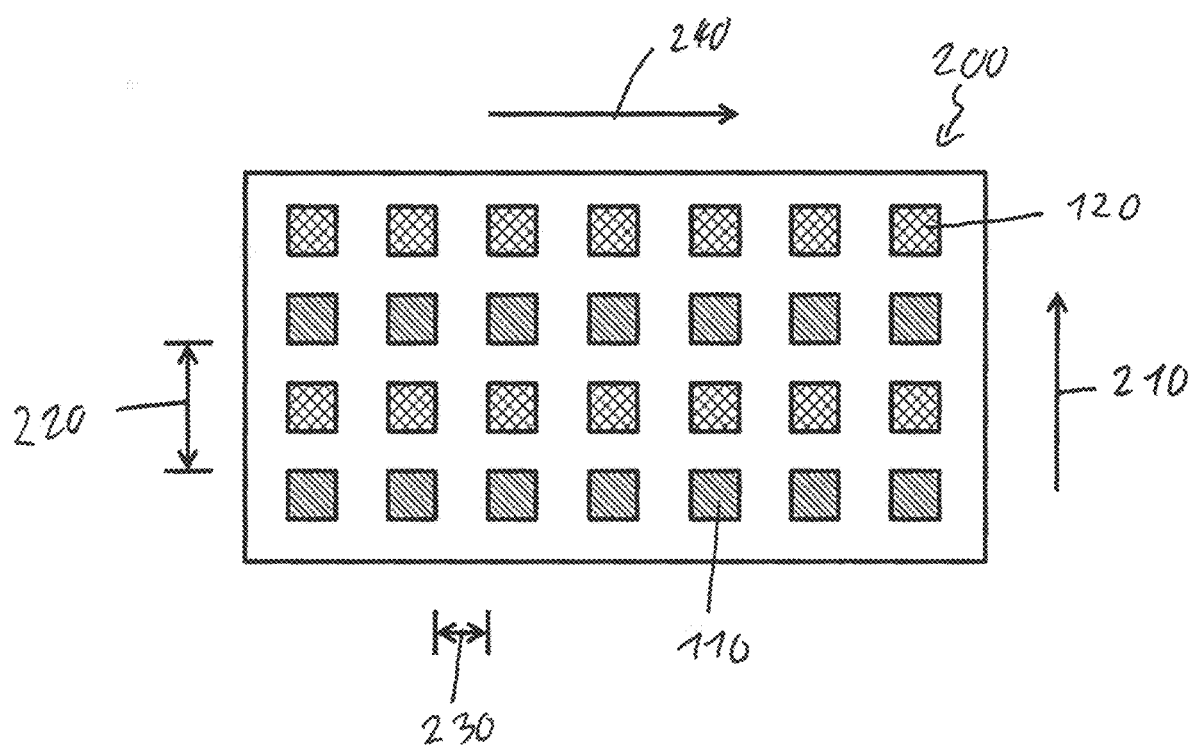
FIG. 2 shows a schematic top view of a part of another thermoelectric device.

FIG. 2 shows a schematic top view of a part of another thermoelectric device 200. The thermoelectric device 200 comprises a plurality of first semiconductor mesa structures 110 having a first conductivity type. Additionally, the thermoelectric device 200 comprises a plurality of second semiconductor mesa structures 120 having a second conductivity type. Second semiconductor mesa structures 120 of the plurality of second semiconductor mesa structures 120 and first semiconductor mesa structures 110 of the plurality of first semiconductor mesa structures 110 are arranged alternating in at least a first lateral direction 210. Further, a first lateral distance 220 between two first semiconductor mesa structures 110 of the plurality of first semiconductor mesa structures 110 located closest (to each other) in the first lateral direction 210 differs from a second lateral distance 230 between two first semiconductor mesa structures 110 of the plurality of first semiconductor mesa structures 110 located closest (to each other) in a second lateral direction 240 by more than 10% (or more than 25%, more than 50%, more than 100%, more than 250% or more than 500%) of the first lateral distance 220.

Due to the difference of the first lateral distance 220 and the second lateral distance 230, the first semiconductor mesa structures 110 of the plurality of first semiconductor mesa structures 110 and the second semiconductor mesa structures 120 of the plurality of second semiconductor mesa structures 120 may be packed denser in the thermoelectric device 200. For example, the first semiconductor mesa structures 110 of the plurality of first semiconductor mesa structures 110 and the second semiconductor mesa structures 120 of the plurality of second semiconductor mesa structures 120 may be arranged in parallel rows in the second lateral dimension 240. By this, a conversion efficiency of the thermoelectric device 200 may be increased.

For example, a minimal distance between two first semiconductor mesa structures 110 of the plurality of first semiconductor mesa structures 110 in the first lateral direction 210 may differ from a minimal distance between two first semiconductor mesa structures 110 of the plurality of first semiconductor mesa structures 110 in the second lateral direction 220 by more than 10% (or more than 25%, more than 50%, more than 100%, more than 250% or more than 500%) of the minimal distance between two first semiconductor mesa structures 110 of the plurality of first semiconductor mesa structures 110 in the first lateral direction 210. For example, a third lateral distance between two neighboring second semiconductor mesa structures 120 of the plurality of second semiconductor mesa structures 120 in the first lateral direction 210 may differs from a fourth lateral distance between two neighboring second semiconductor mesa structures 120 of the plurality of second semiconductor mesa structures 120 in the second lateral direction 240 by more than 10% (or more than 25%, more than 50%, more than 100%, more than 250% or more than 500%) of the third lateral distance. For example, a minimal distance between two second semiconductor mesa structures 120 of the plurality of second semiconductor mesa structures 120 in the first lateral direction 210 may differ from a minimal distance between two second semiconductor mesa structures 120 of the plurality of second semiconductor mesa structures 120 in the second lateral direction 220 by more than 10% (or more than 25%, more than 50%, more than 100%, more than 250% or more than 500%) of the minimal distance between two second semiconductor mesa structures 120 of the plurality of second semiconductor mesa structures 120 in the first lateral direction 210. The first lateral direction 210 may be perpendicular to the second lateral direction 240, for example.

For example, the thermoelectric device 200 may further comprise an insulating structure located laterally between the first semiconductor mesa structures 110 of the plurality of first semiconductor mesa structures 110 and the second semiconductor mesa structures 120 of the plurality of second semiconductor mesa structures 120. The insulating structure may electrically insulate the first semiconductor mesa structures 110 of the plurality of first semiconductor mesa structures 110 laterally from the second semiconductor mesa structures 120 of the plurality of second semiconductor mesa structures 120. Due to the lateral electrical insulation provided by the insulating structure, the first semiconductor mesa structures 110 of the plurality of first semiconductor mesa structures 110 may be located closer to the second semiconductor mesa structures 120 of the plurality of second semiconductor mesa structures 120. By this, a conversion efficiency of the thermoelectric device 200 may be increased.

For example, the insulating structure may fill more than 90% (or more than 95% or more than 99%) of a lateral space between the first semiconductor mesa structures 110 of the plurality of first semiconductor mesa structures 110 and the second semiconductor mesa structures 120 of the plurality of second semiconductor mesa structures 120. The insulating structure may fill the total lateral space between the first semiconductor mesa structures 110 of the plurality of first semiconductor mesa structures 110 and the second semiconductor mesa structures 120 of the plurality of second semiconductor mesa structures 120, for example. For example, the insulating structure may electrically insulate the first semiconductor mesa structures 110 of the plurality of first semiconductor mesa structures 110 laterally from each other and/or the insulating structure may electrically insulate the second semiconductor mesa structures 120 of the plurality of second semiconductor mesa structures 120 laterally from each other. The insulating structure may comprise at least one of glass, glue, plastics, and laminate, for example. For example, the insulating structure may form a glass structure 130.

The implementation of the thermoelectric device 200 may be similar to the implementation of the thermoelectric device described in connection with FIG. 1. For example, the thermoelectric device 200 may be a thermoelectric generator, a Seebeck generator, micro-generator, a thermoelectric cooler, a thermoelectric heater, a Peltier device, a Peltier cooler, a Peltier heater, a thermoelectric heat pump, or a solid state refrigerator.

More details and aspects are mentioned in connection with the embodiments described above or below. The embodiment shown in FIG. 2 may comprise one or more optional additional features corresponding to one or more aspects mentioned in connection with the proposed concept or one or more embodiments described above (e.g. FIG. 1) or below (e.g. FIG. 3-10c).

Figure 3:
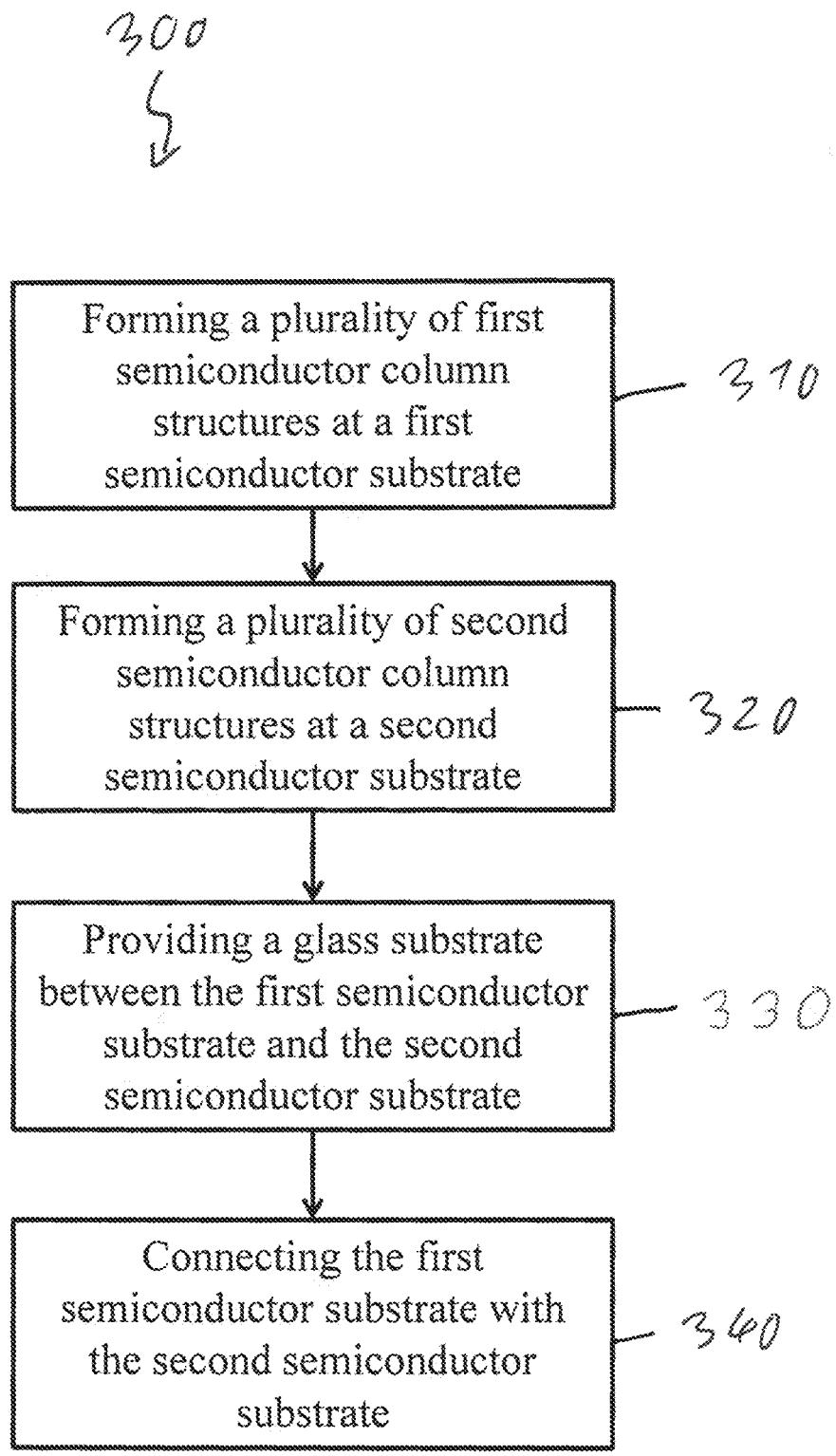
FIG. 3 shows a flow chart of a method for forming a thermoelectric device.

FIG. 3 shows a flow chart of a method 300 for forming a thermoelectric device. The method 300 comprises forming 310 a plurality of first semiconductor mesa structures 110 at a first semiconductor substrate. The first semiconductor substrate has a first conductivity type. Additionally, the method 300 comprises forming 320 a plurality of second semiconductor mesa structures 120 at a second semiconductor substrate. The second semiconductor substrate has a second conductivity type. The method 300 further comprises providing 330 a glass substrate between the first semiconductor substrate and the second semiconductor substrate. Additionally, the method 300 comprises connecting 340 the first semiconductor substrate with (or to) the second semiconductor substrate so that at least a portion of the glass substrate is located laterally between the first semiconductor mesa structures 110 of the plurality of first semiconductor mesa structures 110 and the second semiconductor mesa structures 120 of the plurality of second semiconductor mesa structures 120.

By connecting the first semiconductor substrate with the second semiconductor substrate so that at least a portion of the glass substrate is located laterally between the first semiconductor mesa structures 110 of the plurality of first semiconductor mesa structures 110 and the second semiconductor mesa structures 120 of the plurality of second semiconductor mesa structures 120 the first semiconductor mesa structures 110 of the plurality of first semiconductor mesa structures 110 may be strongly connected with the second semiconductor mesa structures 120 of the plurality of second semiconductor mesa structures 120. Therefore, a thermoelectric device with an increased mechanical stability may be formed. Further, due to the low electrical conductivity of glasses, a high lateral electrical insulation of the first semiconductor mesa structures 110 of the plurality of first semiconductor mesa structures 110 laterally from the second semiconductor mesa structures 120 of the plurality of second semiconductor mesa structures 120 may be provided. Therefore, a lateral distance between neighboring first semiconductor mesa structures 110 of the plurality of first semiconductor mesa structures 110 and second semiconductor mesa structures 120 of the plurality of second semiconductor mesa structures 120 may be reduced. In this way, a number of first semiconductor mesa structures 110 per lateral unit area and a number of second semiconductor mesa structures 120 per lateral unit area of the thermoelectric device may be increased. Therefore, a thermoelectric device with an increased efficiency for converting a temperature difference to an electric voltage or vice versa may be formed. The thermoelectric device described in connection with FIG. 1 and/or the thermoelectric device described in connection with FIG. 2 may be formed using the method 300.

For example, the first semiconductor substrate and/or the second semiconductor substrate may be a semiconductor wafer or a semiconductor die. The semiconductor material of the first semiconductor substrate and/or of the second semiconductor substrate may be silicon (Si), germanium (Ge), silicon-germanium (SiGe), or bismuth telluride ($Bi_2Te_3$). For example, a semiconductor substrate having the first conductivity type may be an n-doped semiconductor substrate (e.g. caused by incorporating nitrogen ions, phosphor ions or arsenic ions) or a p-doped semiconductor substrate (e.g. caused by incorporating aluminum ions or boron ions). Consequently, the second conductivity type indicates an opposite p-doped semiconductor substrate or n-doped semiconductor substrate. In other words, the first conductivity type may indicate a p-doping and the second conductivity type may indicate an n-doping or vice-versa.

For example, the first semiconductor mesa structures 110 of the plurality of first semiconductor mesa structures 110 may be laterally separated from each other by a plurality of first recesses. For example, at least a portion of the second semiconductor mesa structures 120 of the plurality of second semiconductor mesa structures 120 may be at least partially received in the first recesses of the plurality of first recesses. The second semiconductor mesa structures 120 of the plurality of second semiconductor mesa structures 120 may be laterally separated from each other by a plurality of second recesses, for example. For example, at least a portion of the first semiconductor mesa structures 110 of the plurality of first semiconductor mesa structures 110 may be at least partially received in the second recesses of the plurality of second recesses.

For example, connecting 340 the first semiconductor substrate with the second semiconductor substrate may be performed at a temperature of more than 350° C. (or more than 400° C., more than 500° C., more than 600° C., more than 700° C. or more than 750° C.). In this way, the glass wafer may be molten during the connecting 340. By this, the material of the glass wafer may efficiently fill the gaps between the first semiconductor mesa structures 110 of the plurality of first semiconductor mesa structures 110 and the second semiconductor mesa structures 120 of the plurality of second semiconductor mesa structures 120.

For example, connecting 340 the first semiconductor substrate with the second semiconductor substrate may be performed at a temperature of less than 900° C. (or less than 800° C. or less than 700° C.), for example. Connecting 340 the first semiconductor substrate with the second semiconductor substrate may be performed under an inert atmosphere or vacuum, for example. For example, connecting 340 the first semiconductor substrate with the second semiconductor substrate may comprise pressing the first semiconductor substrate against the second semiconductor substrate with a pressure force of more than 1 kN (or more than 2 kN or more than 5 kN) and less than 20 kN (or less than 15 kN or less than 10 kN) or with a pressure of more than 125 kPa (or more than 300 kPa or more than 600 kPa) and/or less than 2500 kPa (or less than 1900 kPa or less than 1200 kPa). For example, the first semiconductor substrate may be connected 340 to the second semiconductor substrate in an inert atmosphere (e.g. argon Ar atmosphere or nitrogen N2 atmosphere) and/or negative pressure or vacuum to avoid or reduce oxidation processes.

For example, connecting 340 the first semiconductor substrate to the second semiconductor substrate may be done by a glass molding process or a precision glass molding process. For example, the glass substrate may be a glass wafer or a glass foil. A material of the glass substrate may be a borosilicate glass (e.g. Borofloat33 or MEMpax), boron-zinc-glass or a low transition temperature glass, for example. For example, the glass substrate comprises or consist of glass material with a coefficient of thermal expansion CTE larger than $2*10^{-6}$ $K^{-1}$ and/or less than $17*10^{-6}$ $K^{-1}$. For example, borosilicate glass comprises a CTE of $3.25*10^{-6}$ $K^{-1}$ and low transition temperature Tg glass comprises a CTE close to $17*10^{-6}$ $K^{-1}$. Low transition temperature Tg glass often has a high CTE while using glass with higher transition temperature may require a more complex temperature control. For example, a borosilicate glass comprising Si—O2, Al—O3, B2-O3, Na2-O and K2-O may be used. The glass pressing process may be done at a transformation temperature representing a point in the viscosity curve between the transition temperature Tg (glass point) and the softening point with Tg<softening point $10^{7.6}$ dPa sec. Low transition temperature Tg glass may be a good material for precision glass molding. Boron-zinc-glass may have good semiconductor insulation properties and a good CTE and process temperature.

For example, forming 310 the plurality of first semiconductor mesa structures 110 comprises forming at least one recess or at least one trench in the first semiconductor substrate. The at least one recess or the at least one trench in the first semiconductor substrate may be formed by at least one of an etching process, a sawing process, a water jet cutting process, and a laser dicing process. In this way, the plurality of first semiconductor mesa structures 110 may be cost efficiently formed. For example, the etching process may comprise a wet etching process, a dry etching process or a plasma etching process.

For example, forming 320 the plurality of second semiconductor mesa structures 120 comprises forming at least one recess or at least one trench in the second semiconductor substrate. The at least one recess or the at least one trench in the second semiconductor substrate may be formed by at least one of an etching process, a sawing process, a water jet cutting process, and a laser dicing process. In this way, the plurality of second semiconductor mesa structures 120 may be cost efficiently formed.

For example, the method 300 may further comprise removing a portion of the first semiconductor substrate after connecting 340 the first semiconductor substrate with the second semiconductor substrate so that the first semiconductor mesa structures 110 of the plurality of first semiconductor mesa structures 110 are separated from each other. Removing the portion of the first semiconductor substrate may comprise thinning the first semiconductor substrate until the material of the glass substrate is uncovered, for example. For example, the portion may be removed by a grinding process.

For example, the method 300 may further comprise removing a portion of the second semiconductor substrate after connecting 340 the first semiconductor substrate with the second semiconductor substrate so that the second semiconductor mesa structures 120 of the plurality of second semiconductor mesa structures 120 are separated from each other. Removing the portion of the second semiconductor substrate may comprise thinning the second semiconductor substrate until the material of the glass substrate is uncovered, for example. For example, the portion may be removed by a grinding process.

For example, the method 300 may further comprise forming a plurality of metallization structures 140 located at a first side and/or a second side of the first semiconductor mesa structures 110 of the plurality of first semiconductor mesa structures 110 and the second semiconductor mesa structures 120 of the plurality of second semiconductor mesa structures 120. Each metallization structure 140 of the plurality of metallization structures 140 may electrically connect a first semiconductor mesa structure 110 of the plurality of first semiconductor mesa structures 110 and a second semiconductor mesa structure 120 of the plurality of second semiconductor mesa structures 120. For example, forming the plurality of metallization structures 140 may comprise depositing a metallization layer at the first side and/or at the second side and structuring the deposited metallization layer. The deposited metallization layer may be structured using an etching process, for example. Forming the plurality of metallization structures 140 may comprise a structured depositing of the metallization structures 140 at the first side and/or the second side, for example. The plurality of metallization structures 140 may be formed after removing the portion of the first semiconductor substrate and/or after removing the portion of the second semiconductor substrate.

More details and aspects are mentioned in connection with the embodiments described above or below. The embodiment shown in FIG. 3 may comprise one or more optional additional features corresponding to one or more aspects mentioned in connection with the proposed concept or one or more embodiments described above (e.g. FIG. 1-2) or below (e.g. FIG. 4a-10c).

Figure 4A:
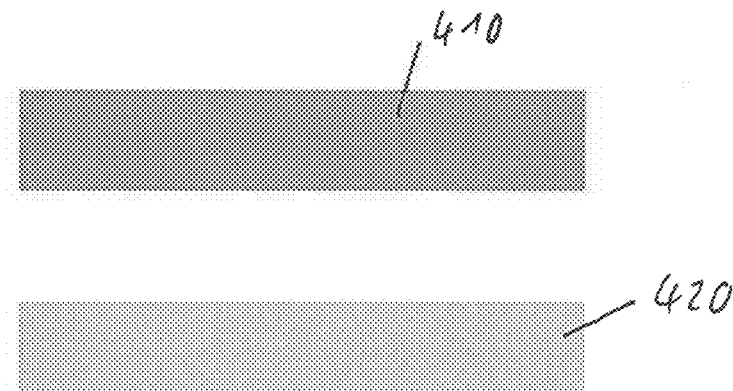
FIGS. 4a-4n show schematic process steps for forming a thermoelectric device.

FIGS. 4a-4n show schematic process steps for forming a thermoelectric device 400. The method for forming the thermoelectric device 400 may be similar to the method described in connection with FIG. 3. FIG. 4a shows a process step, in which a first semiconductor substrate 410 and a second semiconductor substrate 420 are provided. For example, the first semiconductor substrate 410 may be an n-doped silicon wafer and the second semiconductor substrate 420 may be a p-doped silicon wafer.

FIG. 4a shows an example of a provision of an n-doped and a p-doped silicon (Si) wafer with a thermal oxide on the surface. Using two differently doped silicon wafers (n- and p-Si) a basic setup for the thermoelectric device 400 or a micro-generator may be implemented. With regard to the further processing to manufacture micro-structures in the silicon surfaces, three different variants may be used. A first variant may comprise masking (e.g. of the wafer) via a hard mask, anisotropic wet chemical etching (e.g. of the masked wafer) and removal of the mask (e.g. from the wafer). A second variant may comprise masking (e.g. of the wafer) via a hard mask, plasma etching (e.g. of the masked wafer), for example by a BOSCH process, and removal of the mask (e.g. from the wafer). A third variant may comprise mechanical sawing (e.g. of the wafer) in a checkerboard pattern.

Figure 4B:
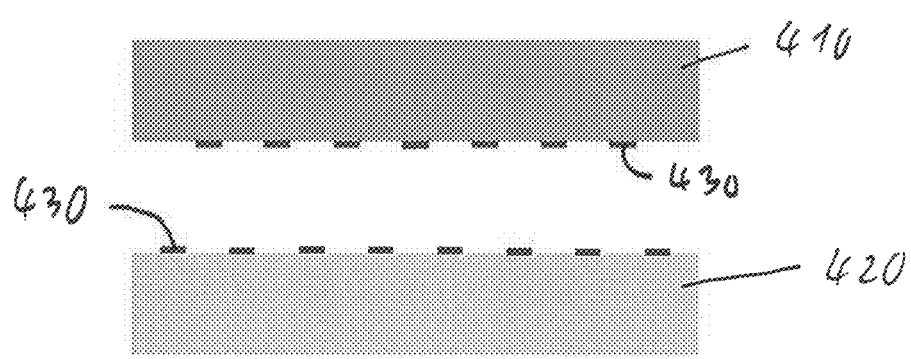
Figure 4C:
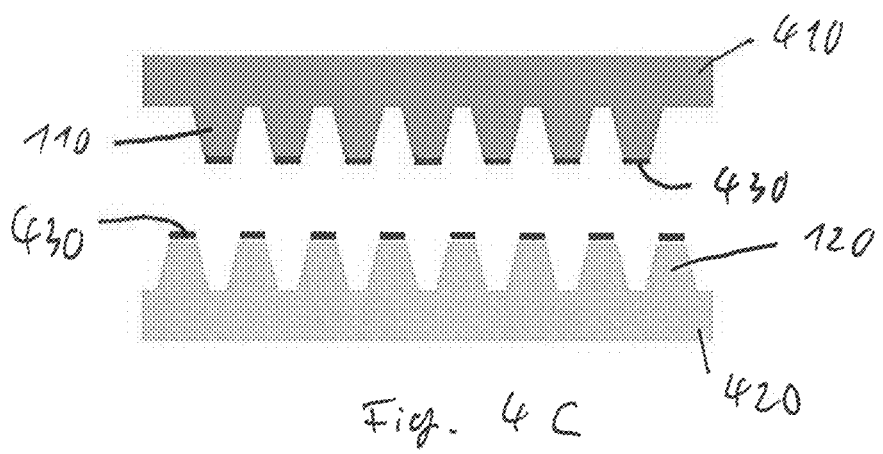
Figure 4D:
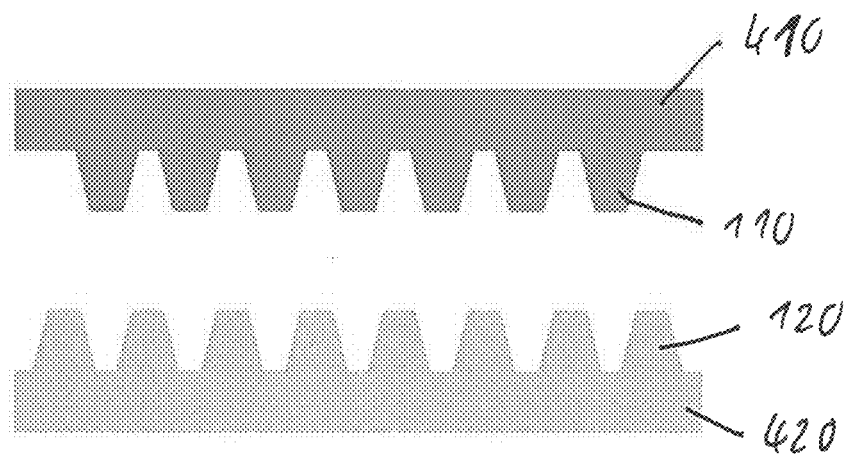

FIGS. 4b to 4d show schematic process steps for forming 310 a plurality of first semiconductor mesa structures 110 in the first semiconductor substrate 410 and for forming 320 a plurality of second semiconductor mesa structures 120 in the second semiconductor substrate 420 using an etching process. As illustrated in FIG. 4b, a patterned hard mask 430 is formed on the first semiconductor substrate 410 and the second semiconductor substrate 420. After forming the patterned hard mask 430, the first semiconductor substrate 410 and the second semiconductor substrate 420 are etched to form the plurality of first semiconductor mesa structures 110 in the first semiconductor substrate 410 and the plurality of second semiconductor mesa structures 120 in the second semiconductor substrate 420 as illustrated in FIG. 4c. The first semiconductor mesa structures 110 of the plurality of first semiconductor mesa structures 110 and the second semiconductor mesa structures 120 of the plurality of second semiconductor mesa structures 120 have a shape of a truncated pyramid. In a following process step the patterned hard mask 430 is removed from the first semiconductor substrate 410 and the second semiconductor substrate 420 as illustrated in FIG. 4d.

The process steps shown in FIGS. 4b to 4d may relate to the first variant and to the second variant. FIG. 4b shows an example of a patterned masking of both wafer surfaces. For example, a hard mask may be attached to the wafer. Then, the non-masked areas may be etched away up to a specific depth using anisotropic etching. FIG. 4c shows an example of pyramidal depth structuring of both wafers. For an optimum power yield per face the pyramid diameters may be in the range of 80 to 150 µm and the heights (e.g. of the pyramids) may be in the range of 300 to 500 µm. Different crystal levels in the silicon may be isolated by means of anisotropic wet chemical etching. When using 100 material (e.g. silicon material), relevant levels may be the levels 110 (45°), 100 (90°) and 111 (54.74°). When using other orientations of the basic crystal (e.g. 110), the anisotropic etching may be optimized in terms of its selectivity and the desired crystal orientation. Thus, in case of anisotropic wet chemical etching vertical side flanks may be generated under certain conditions. Then, the hard mask 430 may be removed. FIG. 4d shows an example of patterned wafers without hard mask 430. In the second variant, like in the first variant, a masking (e.g. by lacquer and/or hard mask 430, depending on the etch depth) may be used. Using plasma etching (e.g. BOSCH etching), vertical trench flanks having a microstructure (scallops) may be formed.

Figure 4E:
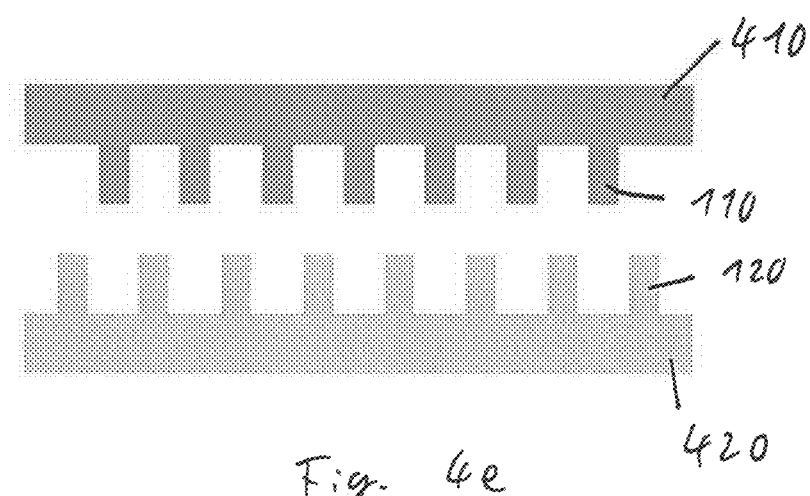

Alternatively or additionally to the process steps shown in FIGS. 4b to 4d the plurality of first semiconductor mesa structures 110 and the plurality of second semiconductor mesa structures 120 may be formed using a sawing process as illustrated in FIG. 4e. The first semiconductor mesa structures 110 of the plurality of first semiconductor mesa structures 110 and the second semiconductor mesa structures 120 of the plurality of second semiconductor mesa structures 120 have a rectangular (vertical) cross section.

According to the third variant, mechanical sawing in a checkerboard pattern may be performed. The third variant may be classified as the most cost-effective one of the three variants. The first variant and the third variant may be more cost-effective than the second variant. FIG. 4e shows an example of wafer surfaces patterned by means of a sawing process. For optimum efficiency, a small mesa diameter may be desired while the mesa length may be sufficient for the temperature gradient.

For example, the first semiconductor wafer 410 and the second semiconductor wafer 420 may be carriers or substrates. For example, in case the plurality of first semiconductor mesa structures 110 and the plurality of second semiconductor mesa structures 120 are formed by a sawing process, their side walls may be formed angular or vertical (e.g. with respect to a surface of the first semiconductor substrate 410 or a surface of the second semiconductor substrate 420). For example, in case the plurality of first semiconductor mesa structures 110 and the plurality of second semiconductor mesa structures 120 are formed by a wet etching process, their side walls may be formed angular or vertical (e.g. with respect to a surface of the first semiconductor substrate 410 or a surface of the second semiconductor substrate 420). For example, in case the plurality of first semiconductor mesa structures 110 and the plurality of second semiconductor mesa structures 120 are formed by a BOSCH etching process, their side walls may be formed vertical (e.g. with respect to a surface of the first semiconductor substrate 410 or a surface of the second semiconductor substrate 420).

Figure 4F:
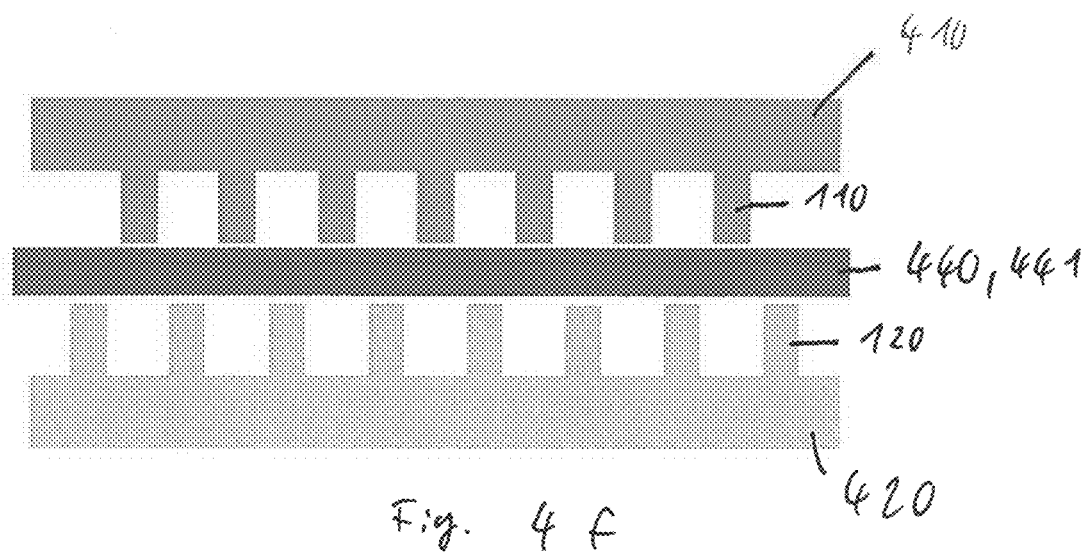
Figure 4G:
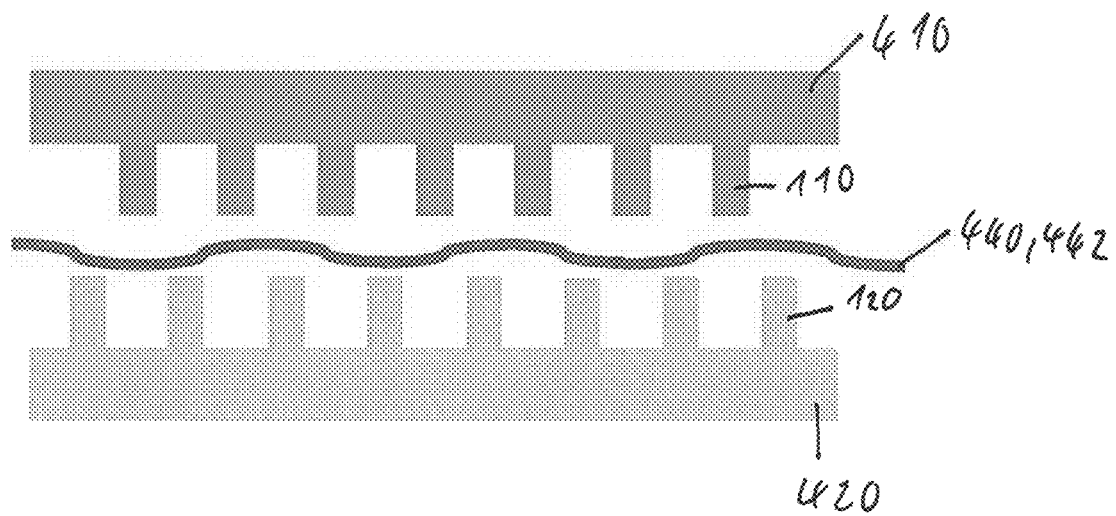

As shown in FIGS. 4f and 4g, a glass substrate 440 may be provided between the first semiconductor wafer 410 and the second semiconductor wafer 420. In the example shown in FIG. 4f the glass substrate 440 is a glass wafer 441 and in the example shown in FIG. 4g the glass substrate 440 is a glass foil 442.

Figure 4H:
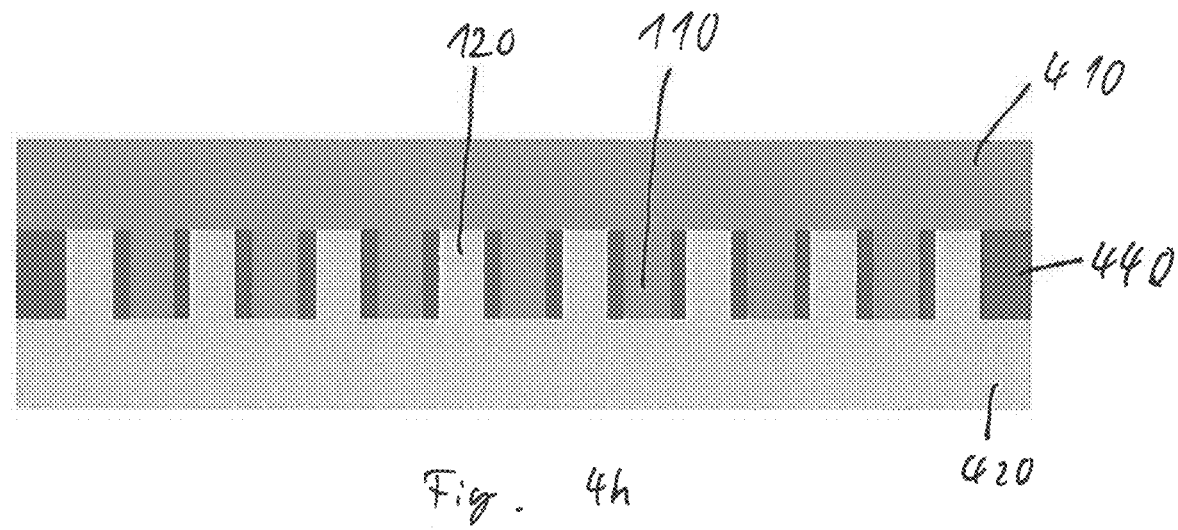

The first semiconductor wafer 410 and the second semiconductor wafer 420 may be connected using a precision glass molding process as illustrated in FIGS. 4g and 4h. FIG. 4h shows an example, in which the glass material of the glass wafer 440 is fully received in the gaps between the first semiconductor mesa structures 110 of the plurality of first semiconductor mesa structures 110 and the second semiconductor mesa structures 120 of the plurality of second semiconductor mesa structures 120. In other examples, glass material of the glass wafer 440 may remain on the tops of the first semiconductor mesa structures 110 of the plurality of first semiconductor mesa structures 110 and/or of the second semiconductor mesa structures 120 of the plurality of second semiconductor mesa structures 120.

For example, the first semiconductor wafer 410 and the second semiconductor wafer 420 may be connected by pressing the first semiconductor wafer 410 towards the second semiconductor wafer 420 with the glass wafer 441 or glass foil 442 in between. The glass substrate 440, i.e. the glass wafer 441 or glass foil 442 is placed between the first semiconductor substrate 410 and the second semiconductor substrate 420. At least one of heat and pressure to the glass substrate 440 to deform the glass substrate 440 so that at least a portion of the glass substrate 440 is moved between the first semiconductor mesa structures 110 of the plurality of first semiconductor mesa structures 110 and the second semiconductor mesa structures 120 of the plurality of second semiconductor mesa structures 120, thereby connecting 340 the first semiconductor substrate 410 to the second semiconductor substrate 420, for example, at a temperature of more than 350° C. and less than 900° C. and/or a pressure force of more than 1 kN and less than 20 kN. In this way, the first semiconductor mesa structures 110 and the second semiconductor mesa structures 120 can be interlocked. Combining the application of heat and temperature for lowering the viscosity of the glass was used successfully. However, the application of heat with less or without pressure or the application of pressure at lower temperature may achieve similar results. This method is termed glass-pressing.

In any case the glass substrate is deformed by the application of heat and/or pressure so that the glass material from the glass substrate moves in between the first semiconductor mesa structures 110 and the second semiconductor mesa structures 120. The viscosity of the glass is reduced by the application of heat and/or pressure and the glass material of the glass substrate can flow in between the mesa structures. With the deformable and liquid glass material generated by the application of heat and/or pressure, the first semiconductor wafer 410 can be moved towards the second semiconductor wafer such that the first semiconductor mesa structures 110 and the second semiconductor mesa structures 120 mesh.

FIG. 4h shows an example of contacted wafers with a laterally positioned glass layer or glass substrate. For example, the wafers (e.g. the first semiconductor wafer 410 and the second semiconductor wafer 420) may be connected by means of the glass pressing method.

Figure 4I:

As illustrated in FIG. 4i a portion of the first semiconductor wafer 410 and a portion of the second semiconductor wafer 420 are removed so that the first semiconductor mesa structures 110 of the plurality of first semiconductor mesa structures 110 are separated from each other and that the second semiconductor mesa structures 120 of the plurality of second semiconductor mesa structures 120 are separated from each other. For example, the portions may be removed by a grinding process. The grinding process may be stopped, when the material of the glass substrate 440 is uncovered.

FIG. 4i shows an example of isolated micro-generator cells in a wafer format. For example, after achieving stability of the wafer composite, the same may be grinded down on the top and the bottom such that the p- and n-areas are available in an electrically isolated state. For example, an intermediate structure is formed, which comprises in a lateral direction repeatedly a p-doped mesa, a glass portion, an n-doped mesa and another glass portion so that the mesa structures are electrically insulated from each other by the glass portions.

Figure 4J:

As illustrated in FIG. 4*j* metallization layers 450 are deposited on two sides of the first semiconductor mesa structures 110 of the plurality of first semiconductor mesa structures 110 and the second semiconductor mesa structures 120 of the plurality of second semiconductor mesa structures 120.

Figure 4K:
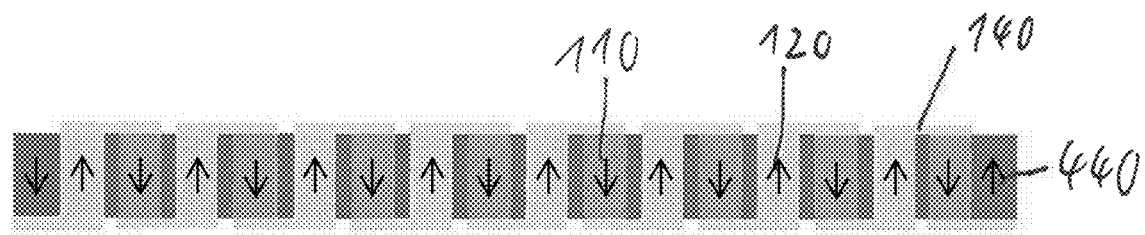

FIG. 4*k* shows an example of metallized micro-generator cells in the wafer format. For example, a metallization may take place on both sides of the cell composite.

As illustrated in FIG. 4*k* the deposed metallization layers 450 may be structured to form a plurality of metallization structures 140. Except for two electrical contacts 140*a*, 140*b* (see FIG. 4*m*), each metallization structure 140 of the plurality of metallization structures 140 electrically connects a first semiconductor mesa structure 110 of the plurality of first semiconductor mesa structures 110 and a second semiconductor mesa structure 120 of the plurality of second semiconductor mesa structures 120, for example. Therefore, the first semiconductor mesa structures 110 of the plurality of first semiconductor mesa structures 110 and the second semiconductor mesa structures 120 of the plurality of second semiconductor mesa structures 120 are electrically connected in series. In this way, a current flow through the plurality of first semiconductor mesa structures 110 and the plurality of second semiconductor mesa structures 120 may be enabled as indicated by the arrows in FIG. 4*k*.

FIG. 4*k* shows an example of a Peltier structure manufactured by means of silicon technology in the wafer format (e.g. a series connection of many thermoelements). For example, the metal layers on top and on the bottom may be structured such that, in each case, an electrical connection may occur from the p-doped to the n-doped cell for a current flow through the cell so that the resulting current path is as long as possible.

Figure 4L:
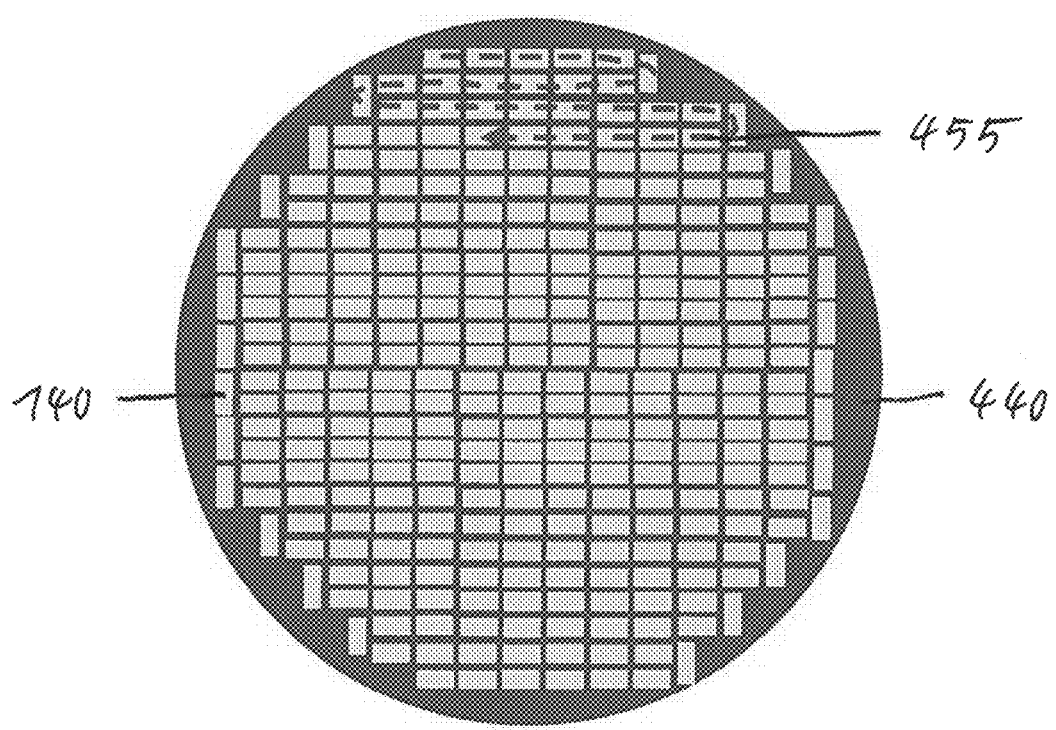

FIG. 4*l* shows a schematic top view of the device shown in FIG. 4*k*. Only the material of the glass wafer 440 and metallization structures 140 of the plurality of metallization structures 140 are visible in this perspective. The metallization structures 140 have a rectangular shape. For example, the metallization structures 140 may electrically connect neighboring first semiconductor mesa structures 110 and second semiconductor mesa structures 120 in series as indicated by the line 455. FIG. 4*l* shows an example of a top view on a Peltier structure in the wafer format with the contacts.

Figure 4M:
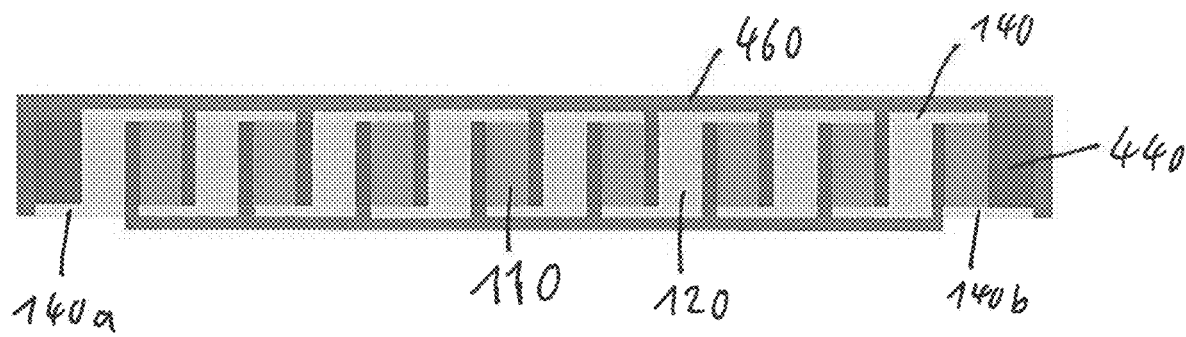
Figure 4H:
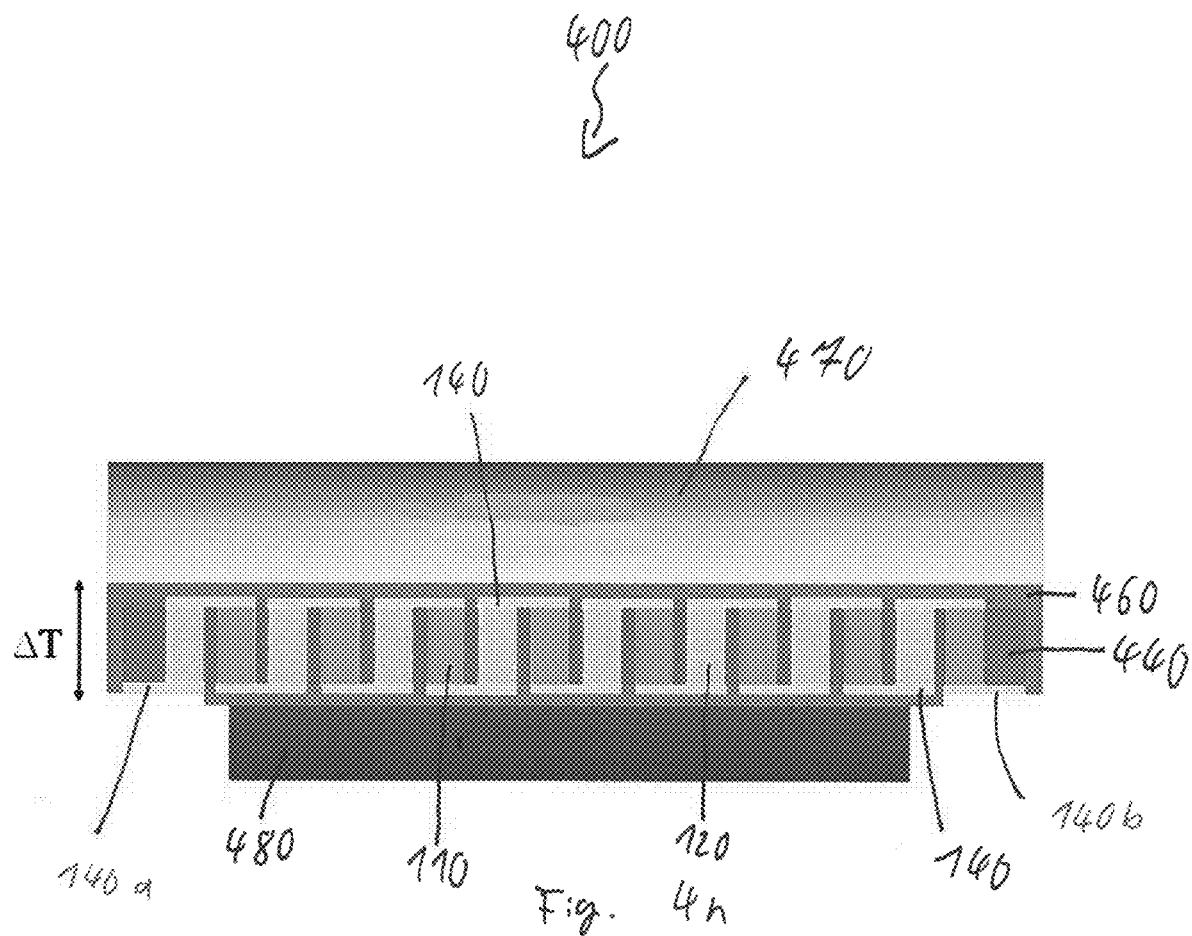

As illustrated in FIG. 4*m* a coating layer 460 is deposited to provide an electrical insulation. The coating layer 460 may comprise at least one of mold, ceramics or a thermal interface material (TIM). FIG. 4*m* shows an example of an electrically isolated, encapsulated, thermal micro-generator (e.g. a thermoelectric device). For example, the device shown in FIGS. 4*k* and 4*l* or a component may be coated (e.g. by mold, ceramics or TIM) to electrically isolate the individual thermoelements leaving two electrical contacts 140*a*, 140*b*, which may be thin and/or heat-conducting, uncovered.

FIG. 4*n* shows the thermoelectric device 400 in operation. The thermoelectric device 400 is in contact with a heat source 470 (e.g. with skin of a person or with a heater element) and a cold side 480 or a cooling element. A temperature difference $\Delta T$ occurs between the heat source 470 and the cold side 480. The metallization structure 140*a* may be a plus-contact and the metallization structure 140*b* may be a ground- or minus-contact.

FIG. 4*n* shows an example of a functional diagram of the thermoelectric device 400. For a miniaturized electric generator (e.g. for the thermoelectric device 400), Peltier cells may now be sawn out of the wafer composite depending on the floor space requirements and the desired power. The generated voltage depends on the number of pairs of cells, the temperature gradient and the Seebeck coefficient (e.g. 440 µV/K for silicon). For a cell area of only 2.5×2.5 mm² with approx. 1000 individual cells, a temperature gradient of 3 degree Celsius at the upper and lower contacts (e.g. at the upper and lower metallization structures 140) may lead to a calculated voltage of approximately 1.3V and an electric power in the milliwatt range. For example, at the corresponding metal layers, the further contacting to the current-dissipating contacts may take place via a metallic bonding process (e.g. using solder, diffusion solder or sinter process paste).

More details and aspects are mentioned in connection with the embodiments described above or below. The embodiments shown in FIGS. 4*a*-4*n* may comprise one or more optional additional features corresponding to one or more aspects mentioned in connection with the proposed concept or one or more embodiments described above (e.g. FIG. 1-3) or below (e.g. FIG. 5-10*c*).

Figure 5:
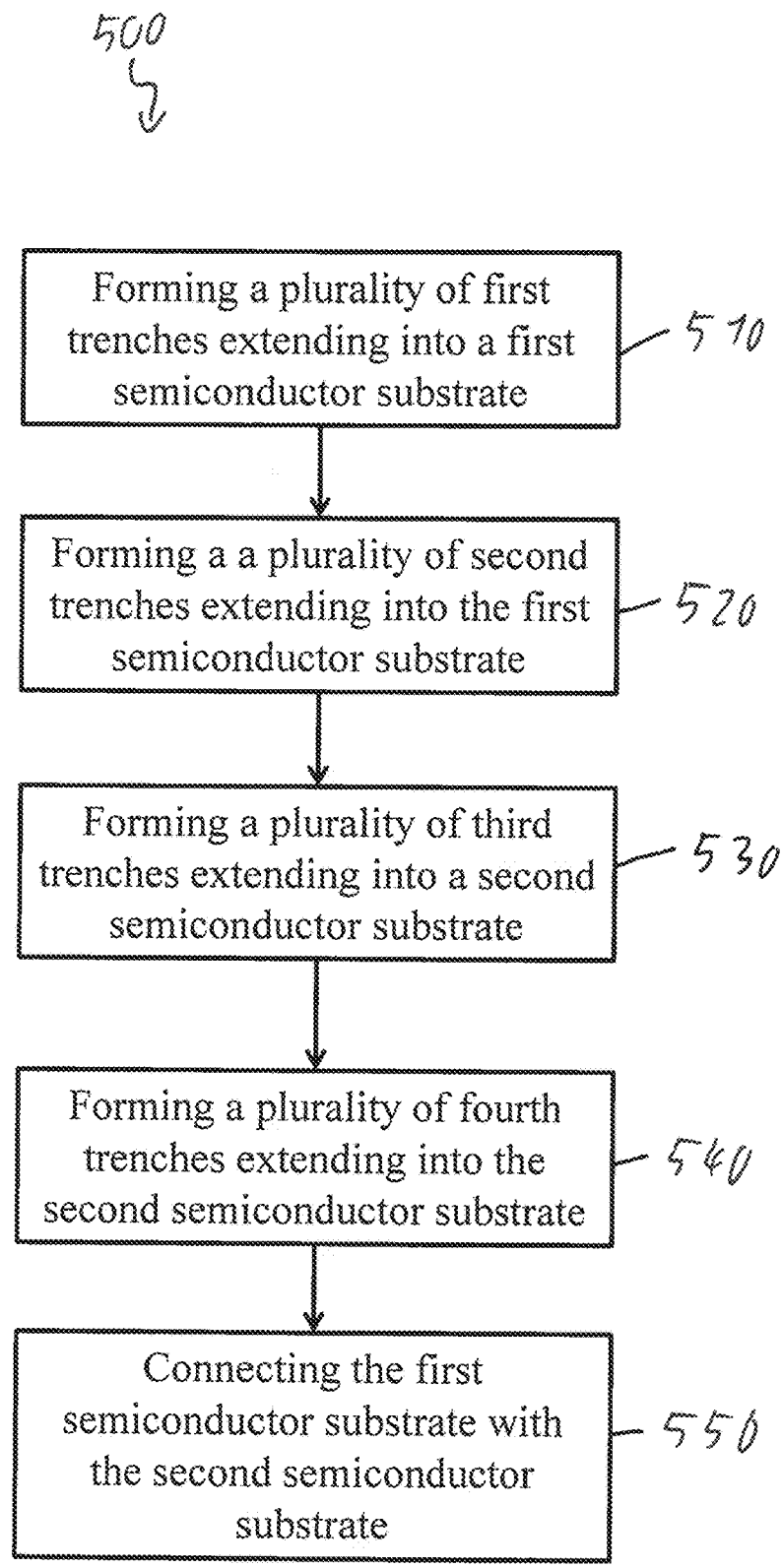
FIG. 5 shows a flow chart of another method for forming a thermoelectric device.

FIG. 5 shows a flow chart of another method 500 for forming a thermoelectric device. The method 500 comprises forming 510 a plurality of first trenches extending into a first semiconductor substrate 410. The first trenches of the plurality of first trenches extend along a first lateral direction. Further, the first semiconductor substrate 410 has a first conductivity type. Additionally, the method 500 comprises forming 520 a plurality of second trenches extending into the first semiconductor substrate 410. The second trenches of the plurality of second trenches extend along a second lateral direction to form a plurality of first semiconductor mesa structures 110 at the first semiconductor substrate 410. The method 500 further comprises forming 530 a plurality of third trenches extending into a second semiconductor substrate 420. The third trenches of the plurality of third trenches extend along a third lateral direction. Further, the second semiconductor substrate 420 has a second conductivity type. Additionally, the method 500 comprises forming 540 a plurality of fourth trenches extending into the second semiconductor substrate 420. The fourth trenches of the plurality of fourth trenches extend along a fourth lateral direction to form a plurality of second semiconductor mesa structures 120 at the second semiconductor substrate 420. The method 500 further comprises connecting 550 the first semiconductor substrate 410 with (or to) the second semiconductor substrate 420.

Since the plurality of first semiconductor mesa structures 110 and the plurality of second semiconductor mesa structures 120 are each formed in a single processing step, the thermoelectric device may be formed more cost effectively. The thermoelectric device described in connection with FIG. 1, the thermoelectric device described in connection with FIG. 2 and/or the thermoelectric device described in connection with FIGS. 4*a*-4*n* may be formed using the method 500.

For example, forming 510 the plurality of first trenches, forming 520 the plurality of second trenches, forming 530 the plurality of third trenches and/or forming 540 the plurality of fourth trenches may comprise an etching process, a sawing process, a water jet cutting process, and/or a laser dicing process. For example, the longest dimension of the respective trench may extend along the respective lateral direction. The first lateral direction may be perpendicular to the second lateral direction and/or the third lateral direction may be perpendicular to the fourth lateral direction, for example.

For example, in case the first semiconductor substrate 410 and the second semiconductor substrate 420 are equally orientated during forming 510 the plurality of first trenches, forming 520 the plurality of second trenches, forming 530 the plurality of third trenches and forming 540 the plurality of fourth trenches, the first lateral direction may be equal to the third lateral direction and the second lateral direction may be equal to the fourth lateral direction.

For example, the first semiconductor substrate 410 may be connected with the second semiconductor substrate 420 so that each first semiconductor mesa structure 110 of the plurality of first semiconductor mesa structures 110 is laterally arranged between two second semiconductor mesa structures 120 of the plurality of second semiconductor mesa structures 120.

For example, a width of the second trenches of the plurality of second trenches may be less than 90% (or less than 75%, less than 50% or less than 25%) of a width of the first trenches of the plurality of first trenches. A width of the fourth trenches of the plurality of fourth trenches may be less than 90% (or less than 75%, less than 50% or less than 25%) of a width of the third trenches of the plurality of third trenches, for example. For example, a width of the first trenches of the plurality of first trenches and a width of the second trenches of the plurality of second trenches may differ by more than 10% (or more than 25%, more than 50% or more than 75%) of the width of the first trenches of the plurality of first trenches. A width of the third trenches of the plurality of third trenches and a width of the fourth trenches of the plurality of fourth trenches may differ by more than 10% (or more than 25%, more than 50% or more than 75%) of the width of the third trenches of the plurality of third trenches.

For example, the first trenches of the plurality of first trenches and the second trenches of the plurality of second trenches may by formed by a sawing process using sawing blades having different thickness. In this way, the thermoelectric device may be cost efficiently formed. For example, the third trenches of the plurality of third trenches and the fourth trenches of the plurality of fourth trenches may by formed by a sawing process using sawing blades having different thickness. In this way, the thermoelectric device may be cost efficiently formed.

More details and aspects are mentioned in connection with the embodiments described above or below. The embodiment shown in FIG. 5 may comprise one or more optional additional features corresponding to one or more aspects mentioned in connection with the proposed concept or one or more embodiments described above (e.g. FIG. 1-4n) or below (e.g. FIG. 6a-10c).

Figure 6A:
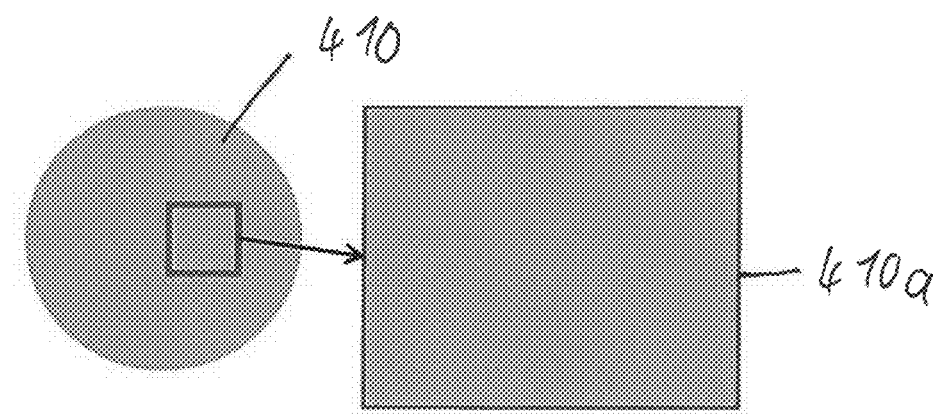
FIGS. 6a-6g show schematic process steps for forming thermoelectric devices.
Figure 6B:
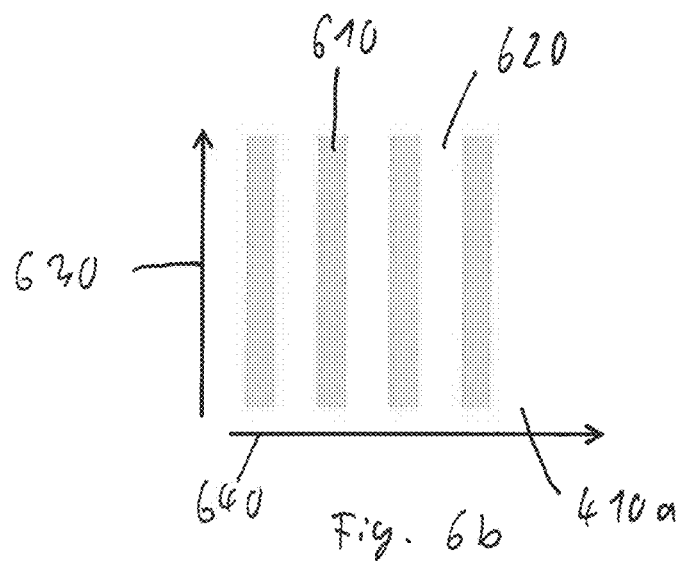
Figure 6C:
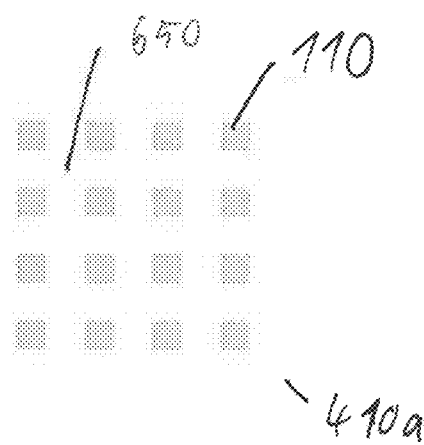
Figure 6D:
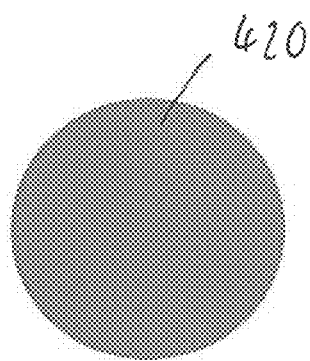
Figure 6E:
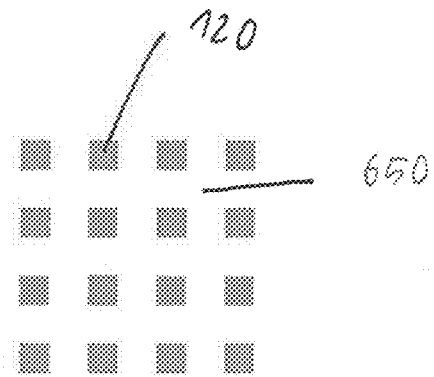
Figure 6F:
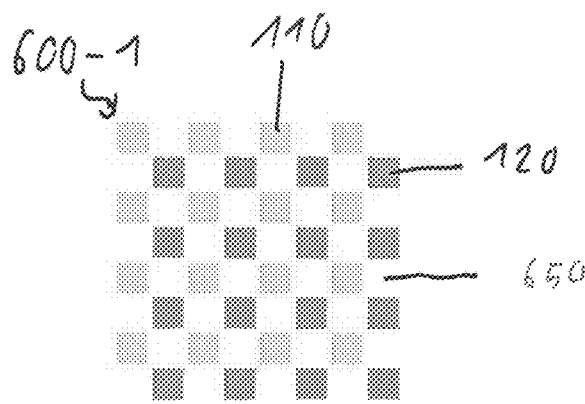
Figure 6G:
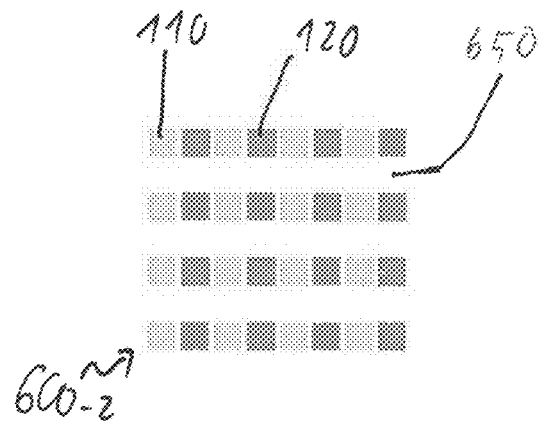

FIGS. 6a to 6g show schematic process steps for forming thermoelectric devices 600. The method for forming the thermoelectric devices 600 may be similar to the method described in connection with FIG. 3 or similar to the method described in connection with FIG. 5. FIG. 6a shows a first semiconductor substrate 410. For example, the first semiconductor substrate 410 may be a p-doped semiconductor wafer. In a portion 410a of the first semiconductor substrate 410 a plurality of semiconductor row structures and a plurality of trenches 620 extending in a first lateral direction 630 are formed in the portion 410a of the first semiconductor substrate 410 as shown in FIG. 6b. Afterward, a plurality of further trenches extending in a second lateral direction 640 is formed in the portion 410a of the first semiconductor substrate 410 as shown in FIG. 6c. Therefore, a plurality of first semiconductor mesa structures 110 and a plurality of recesses 650 are formed. FIG. 6d shows a second semiconductor substrate 420. For example, the second semiconductor substrate 420 may be an n-doped semiconductor wafer. As shown in FIG. 6e, a plurality of second semiconductor mesa structures 120 and a plurality of recesses 650 are formed in the second semiconductor substrate 420 similar to the process steps described in connection with FIGS. 6b and 6c. The first semiconductor substrate 410 and the second semiconductor substrate 420 may be connected to form the thermoelectric devices 600-1, 600-2 as shown in FIGS. 6f and 6g. In the thermoelectric device 600-1 the first semiconductor mesa structures 110 of the plurality of first semiconductor mesa structures 110 and the recesses 650 of the plurality of recesses 650 are arranged alternating in rows and columns and the second semiconductor mesa structures 120 of the plurality of second semiconductor mesa structures 120 and the recesses 650 of the plurality of recesses 650 are arranged alternating in rows and columns. In the thermoelectric device 600-2 the first semiconductor mesa structures 110 of the plurality of first semiconductor mesa structures 110 and the second semiconductor mesa structures 120 of the plurality of second semiconductor mesa structures 120 are arranged alternating in rows and the recesses 650 of the plurality of recesses 650 are arranged in rows.

FIGS. 6a to 6g show an example of mesa etching or mesa cutting in one step and one substrate for each n- and p-doped. For example, the plurality of recesses 650 may be formed by vertical and horizontal cuts of same thickness. The cuts may be formed by sawing or etching, for example. For example, a thickness of the cuts in the first lateral direction 630 may be equal to a thickness of the cuts in the second lateral direction 640. For example, the thickness of the cuts in the first lateral direction 630 and/or the thickness of the cuts in the second lateral direction 640 may be greater than a maximal lateral dimension of the first semiconductor mesa structures 110 of the plurality of first semiconductor mesa structures 110 and a maximal lateral dimension of the second semiconductor mesa structures 120 of the plurality of second semiconductor mesa structures 120 in the first lateral direction 630 and in the second lateral direction 640. For example, the first semiconductor mesa structures 110 of the plurality of first semiconductor mesa structures 110 and the second semiconductor mesa structures 120 of the plurality of second semiconductor mesa structures 120 may be quadratic mesa structures (e.g. may have the same lateral dimension in the first lateral direction 630 and in the second lateral direction 640). For example, the first semiconductor mesa structures 110 of the plurality of first semiconductor mesa structures 110 and the second semiconductor mesa structures 120 of the plurality of second semiconductor mesa structures 120 may be separated from each other (e.g. in the first lateral direction 630 and in the second lateral direction 640) after connecting 550 the first semiconductor substrate 410 with the second semiconductor substrate 420. For example, the recesses 650 of the plurality of recesses 650 may be filled with glass.

More details and aspects are mentioned in connection with the embodiments described above or below. The embodiments shown in FIGS. 6a-6g may comprise one or more optional additional features corresponding to one or more aspects mentioned in connection with the proposed concept or one or more embodiments described above (e.g. FIG. 1-5) or below (e.g. FIG. 7a-10c).

Figure 7A:
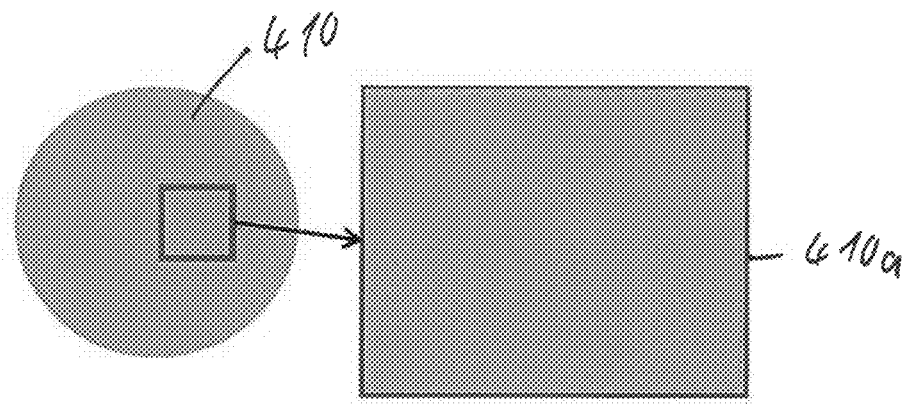
FIGS. 7a-7e show schematic process steps for forming another thermoelectric device.
Figure 7B:
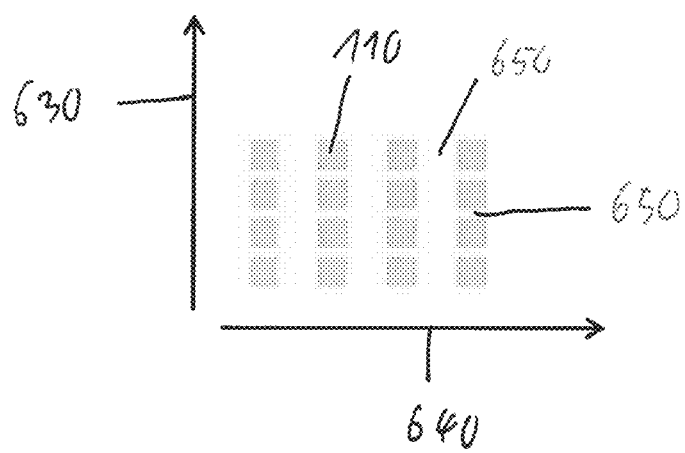
Figure 7C:
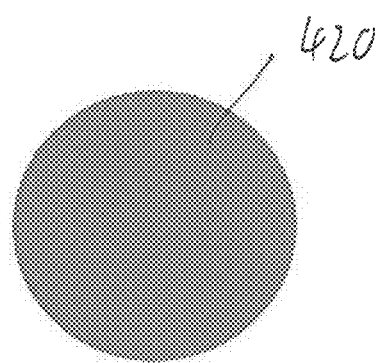
Figure 7D:
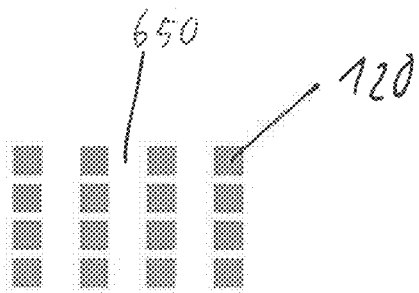
Figure 7E:
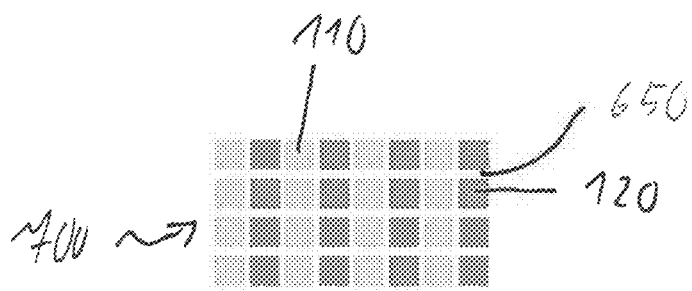

FIGS. 7a to 7e show schematic process steps for forming another thermoelectric device 700. The method for forming the thermoelectric devices 700 may be similar to the method described in connection with FIG. 3 or similar to the method described in connection with FIG. 5. FIG. 7a shows a first semiconductor substrate 410. For example, the first semiconductor substrate 410 may be a p-doped semiconductor wafer. In a portion 410a of the first semiconductor substrate 410 a plurality of first semiconductor mesa structures 110 and a plurality of recesses 650 are formed as shown in FIG. 7b. FIG. 7c shows a second semiconductor substrate 420. For example, the second semiconductor substrate 420 may be an n-doped semiconductor wafer. As shown in FIG. 7d, a plurality of second semiconductor mesa structures 120 and a plurality of recesses 650 are formed in the second semiconductor substrate 420. The first semiconductor substrate 410 and the second semiconductor substrate 420 may be connected to form the thermoelectric device 700 as shown in FIG. 7e. In the thermoelectric device 700 the first semiconductor mesa structures 110 of the plurality of first semiconductor mesa structures 110 and the second semiconductor mesa structures 120 of the plurality of second semiconductor mesa structures 120 are arranged alternating in rows. Further, the first semiconductor mesa structures 110 of the plurality of first semiconductor mesa structures 110 are arranged in columns and the second semiconductor mesa structures 120 of the plurality of second semiconductor mesa structures 120 are arranged in columns.

FIGS. 7a to 7e show an example of mesa etching or mesa cutting in one step and one substrate for each n- and p-doped. Hereby, a dense package may be formed. For example, the plurality of recesses 650 may be formed by vertical and horizontal cuts of different thickness. The cuts may be formed by sawing or etching, for example. For example, a thickness of the cuts in the first lateral direction 630 may be less than a thickness of the cuts in the second lateral direction 640. For example, the first semiconductor mesa structures 110 of the plurality of first semiconductor mesa structures 110 and the second semiconductor mesa structures 120 of the plurality of second semiconductor mesa structures 120 may be quadratic mesa structures (e.g. may have the same lateral dimension in the first lateral direction 630 and in the second lateral direction 640). For example, the first semiconductor mesa structures 110 of the plurality of first semiconductor mesa structures 110 and the second semiconductor mesa structures 120 of the plurality of second semiconductor mesa structures 120 may be separated from each other (e.g. in the first lateral direction 630 and in the second lateral direction 640) after connecting 550 the first semiconductor substrate 410 with the second semiconductor substrate 420. For example, the recesses 650 of the plurality of recesses 650 may be filled with glass.

More details and aspects are mentioned in connection with the embodiments described above or below. The embodiments shown in FIGS. 7a-7e may comprise one or more optional additional features corresponding to one or more aspects mentioned in connection with the proposed concept or one or more embodiments described above (e.g. FIG. 1-6g) or below (e.g. FIG. 8a-10c).

Figure 8A:
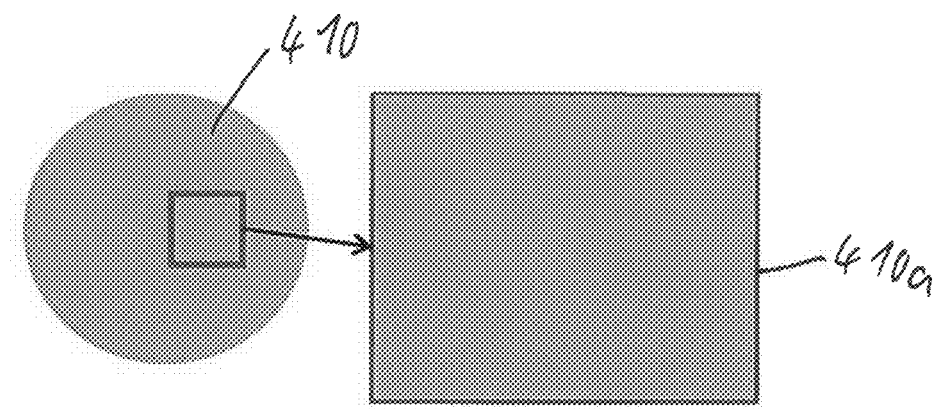
FIGS. 8a-8e show schematic process steps for forming another thermoelectric device.
Figure 8B:
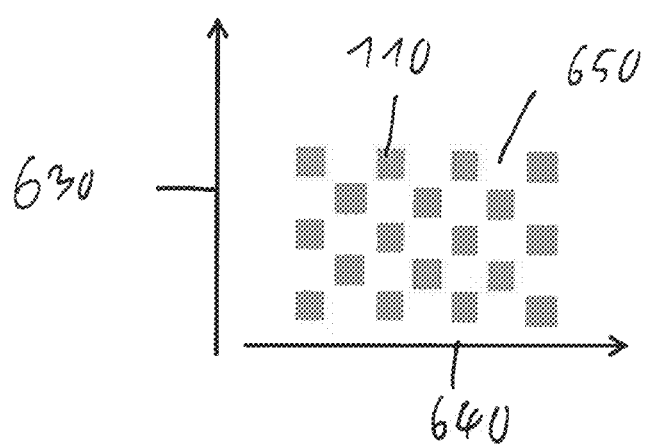
Figure 8C:
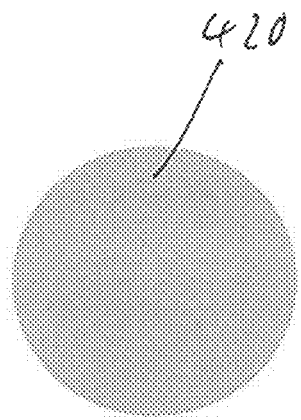
Figure 8D:
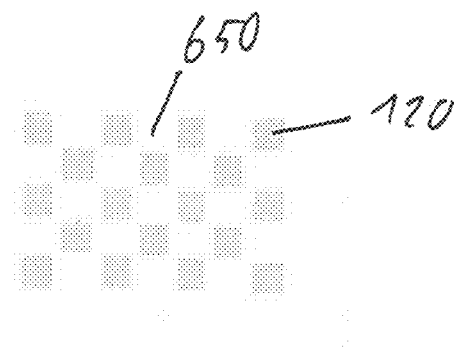
Figure 8E:
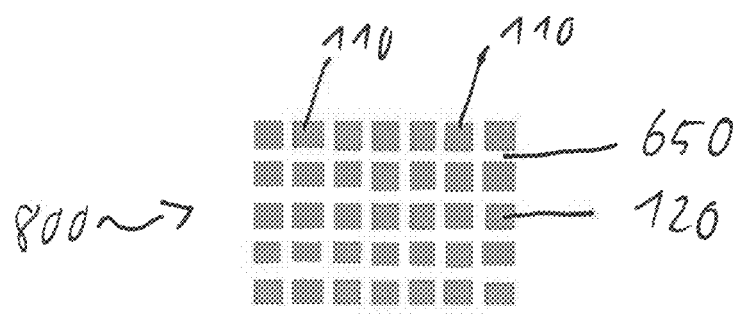

FIGS. 8a to 8e show schematic process steps for forming another thermoelectric device 800. The method for forming the thermoelectric devices 800 may be similar to the method described in connection with FIG. 3 or similar to the method described in connection with FIG. 5. FIG. 8a shows a first semiconductor substrate 410. For example, the first semiconductor substrate 410 may be a p-doped semiconductor wafer. In a portion 410a of the first semiconductor substrate 410 a plurality of first semiconductor mesa structures 110 and a plurality of recesses 650 are formed as shown in FIG. 8b. FIG. 8c shows a second semiconductor substrate 420. For example, the second semiconductor substrate 420 may be an n-doped semiconductor wafer. As shown in FIG. 8d, a plurality of second semiconductor mesa structures 120 and a plurality of recesses 650 are formed in the second semiconductor substrate 420. The first semiconductor substrate 410 and the second semiconductor substrate 420 may be connected to form the thermoelectric device 800 as shown in FIG. 8e. In the thermoelectric device 800 the first semiconductor mesa structures 110 of the plurality of first semiconductor mesa structures 110 and the second semiconductor mesa structures 120 of the plurality of second semiconductor mesa structures 120 are arranged alternating in rows and columns.

FIGS. 8a to 8e show an example of mesa etching using an etching mask in one step and one substrate or a combination of sawing (e.g. of thin lines) and etching (e.g. of thick recesses). Hereby, a dense package may be formed using an etching process. For example, the plurality of recesses 650 may be formed by vertical and horizontal cuts of different thickness. The cuts may be formed by etching, for example. For example, a thickness of the cuts in the first lateral direction 630 may be less than a thickness of the cuts in the second lateral direction 640. For example, the first semiconductor mesa structures 110 of the plurality of first semiconductor mesa structures 110 and the second semiconductor mesa structures 120 of the plurality of second semiconductor mesa structures 120 may be quadratic mesa structures (e.g. may have the same lateral dimension in the first lateral direction 630 and in the second lateral direction 640). For example, the first semiconductor mesa structures 110 of the plurality of first semiconductor mesa structures 110 and the second semiconductor mesa structures 120 of the plurality of second semiconductor mesa structures 120 may be separated from each other (e.g. in the first lateral direction 630 and in the second lateral direction 640) after connecting 550 the first semiconductor substrate 410 with the second semiconductor substrate 420. For example, the recesses 650 of the plurality of recesses 650 may be filled with glass.

More details and aspects are mentioned in connection with the embodiments described above or below. The embodiments shown in FIGS. 8a-8e may comprise one or more optional additional features corresponding to one or more aspects mentioned in connection with the proposed concept or one or more embodiments described above (e.g. FIG. 1-7e) or below (e.g. FIG. 9a-10c).

FIGS. 9a to 9d show different mesa structure geometries. For example, the first semiconductor mesa structures 110 of the plurality of first semiconductor mesa structures 110 and/or the second semiconductor mesa structures 120 of the plurality of second semiconductor mesa structures 120 may have one of the mesa structure geometries shown in FIGS. 9a to 9d. FIGS. 9a to 9d show examples of mesa shapes in top and side view.

Figure 9A:
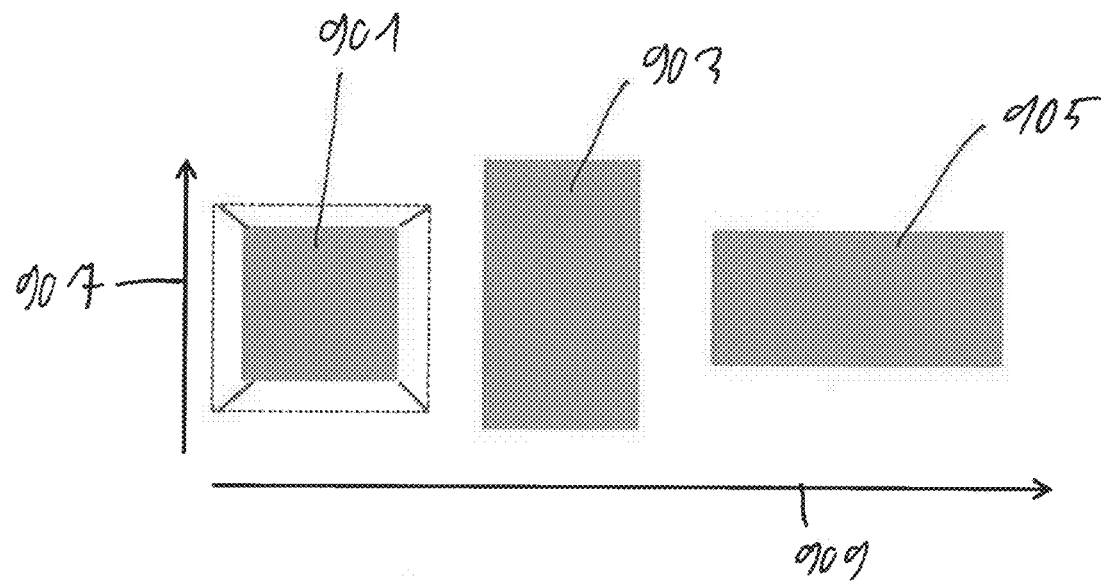
FIGS. 9a-9d show different mesa structure geometries.

FIG. 9a shows a top view on mesa structure geometries 901, 903, 905. The arrows 907, 909 indicate lateral directions. The mesa structure geometry 901 is quadratic (e.g. the lateral dimension in direction 907 is equal to the lateral dimension in direction 909). A lateral dimension of a basis of the mesa structure geometry 901 is greater than a lateral dimension of a plateau of the mesa structure geometry 901. Therefore, the mesa structure geometry 901 may form a pyramid or a truncated pyramid. The mesa structure geometries 903, 905 are rectangular (e.g. the lateral dimension in direction 907 differs from the lateral dimension in direction 909).

Figure 9B:
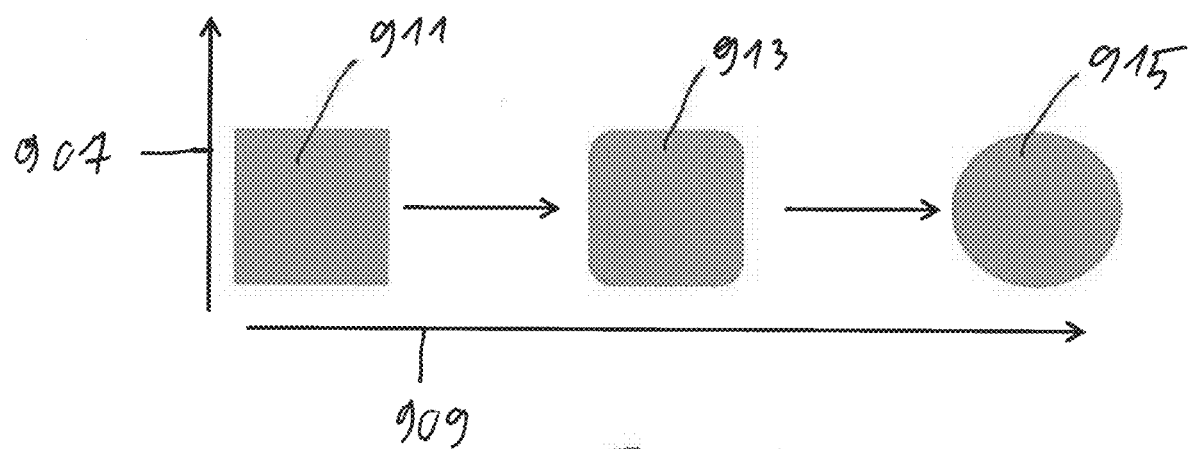

FIG. 9b shows a top view on mesa structure geometries 911, 913, 915. The corners and edges of the mesa structure geometries 911, 913, 915 may be rounded. The mesa structure geometry 915 shows a limiting case, in which the mesa structure is round.

Figure 9C:
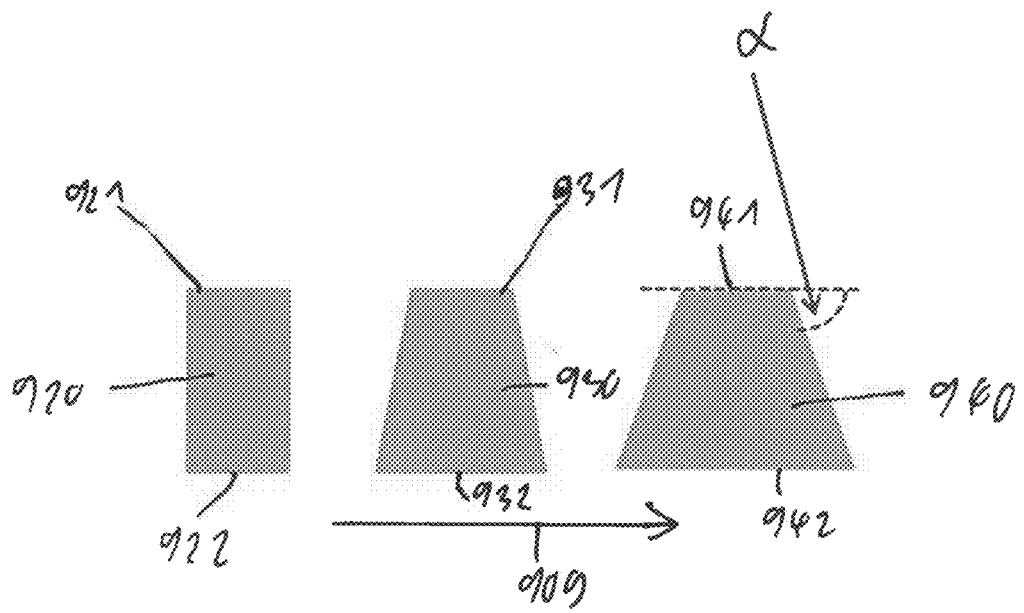

FIG. 9c show a side view on mesa structure geometries 920, 930, 940. The arrow 909 indicates a lateral direction. A lateral dimension of a plateau 921 of the mesa structure geometry 920 is equal to a lateral dimension of a basis 922 of the mesa structure geometry 920. Further, a lateral dimension of a plateau 931 of the mesa structure geometry 930 is less than a lateral dimension of a basis 932 of the mesa structure geometry 930. Further, a lateral dimension of a plateau 941 of the mesa structure geometry 940 is less than a lateral dimension of a basis 942 of the mesa structure geometry 940. Typical values for the angle α, for example for silicon in 100 orientation (e.g. in surface orientation), in the mesa structure geometry 940 may be 45° along the 110 plane, 54.7° along the 111 plane, and 90° along the 100 plane.

Figure 9D:
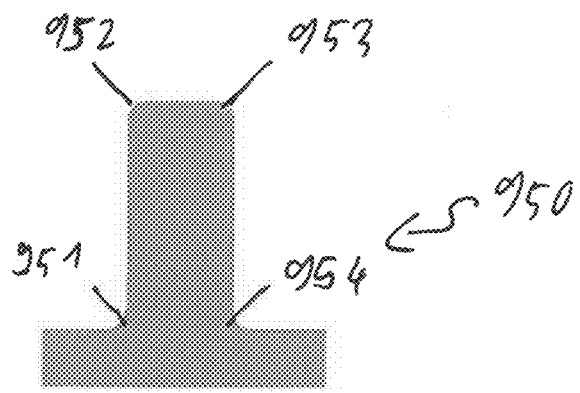

FIG. 9d show a side view on mesa structure geometry 950. The mesa structure geometry 950 has rounded edges 951, 952, 953, 954. FIG. 9d shows an example of a substrate wafer before the grinding or the thinning.

More details and aspects are mentioned in connection with the embodiments described above or below. The embodiments shown in FIGS. 9a-9d may comprise one or more optional additional features corresponding to one or more aspects mentioned in connection with the proposed concept or one or more embodiments described above (e.g. FIG. 1-8e) or below (e.g. FIG. 9a-10c).

Figure 10A:
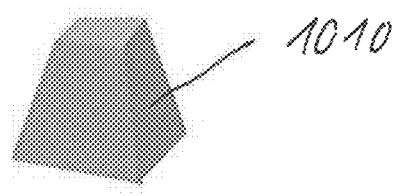
FIGS. 10a-10c show perspective views on different mesa structure geometries.
Figure 10B:
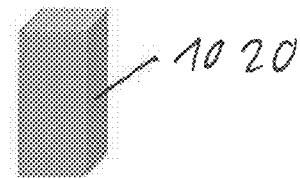
Figure 10C:
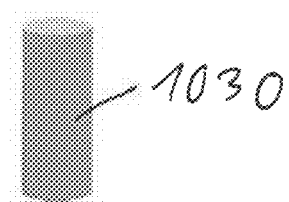

FIGS. 10a to 10c show perspective views on different mesa structure geometries 1010, 1020, 1030. For example, the first semiconductor mesa structures 110 of the plurality of first semiconductor mesa structures 110 and/or the second semiconductor mesa structures 120 of the plurality of second semiconductor mesa structures 120 may have one of the mesa structure geometries shown in FIGS. 10a to 10c. The mesa structure geometry 1010 is a truncated pyramid, the mesa structure geometry 1020 is a cuboid, and the mesa structure geometry 1030 is a cylinder.

More details and aspects are mentioned in connection with the embodiments described above or below. The embodiments shown in FIGS. 10a-10c may comprise one or more optional additional features corresponding to one or more aspects mentioned in connection with the proposed concept or one or more embodiments described above (e.g. FIG. 1-9d) or below.

Some embodiments relate to an energy harvesting silicon based device.

Some embodiments relate to energy harvesting using a silicon-based Peltier element.

An aspect relates to a thermoelectric device or a thermoelectric micro-generator that may collect consumption heat from the environment (e.g. body heat) and may transform it into DC voltage in line with the Seebeck effect. The small size of the component and the high degree of utilization of the transformation of heat into voltage may enable the use for wireless sensors and, e.g., wearable electronic components. One advantage may be that a battery disturbing in terms of weight and having to be maintained may be saved or that an external power source may be saved. Furthermore, sensors operated by micro-generators may be used anywhere and may be flexible in terms of spatial requirements. The thermoelectric micro-generator may operate maintenance-free and may have a very long service life. The function to generate voltage may only require a few degrees Celsius of temperature difference. Each individual thermoelectric unit may generate a current of approx. 440 µV/K (temperature difference; Si-Seebeck-coefficient) and an electric power in the mW range up to several Watt in case of larger differences in temperature. This may be used to operate micro-sensors, e.g., for the manual contactless control of electric devices. As many devices combine an increasing number of functions on an ever-decreasing area, manual contactless control may offer a significant advantage. Using it in controlling systems in line with the industry 4.0 concept may also be conceivable. For example, a fingertip gesture control interface may be realized. Operating a so-called Soli chip wirelessly using a thermo-electric micro-generator may provide a considerable advantage for the further market launch. Here, a 1.8V voltage may be provided at a power of 54 mW without a mains connection.

A further aspect may relate to the possibility to use known processes from the silicon wafer technology to manufacture an efficient and cost-effective thermoelectric micro-generator (e.g. the thermoelectric device). By using this technology and the associated freedom in design, more efficient thermoelement cells (e.g., having a larger aspect ratio) may be manufactured. Due to the design and the high level of efficiency, the micro-generator thus produced may use even lower thermal differences of only a few degrees in order to generate electric power levels in this connection as required for the operation of wireless sensors. The thermoelectric device may provide one or all of the following advantages: use of cost-effective silicon as the thermoelectric basic material, more cost-effective manufacture because of the use of known silicon technology processes and that work may be performed at wafer level, higher functional and more efficiently working component due to the larger design freedom when producing the thermoelement cells (e.g. aspect ratio), and market expansion for components, e.g., wireless sensors, radar sensor amongst others.

A further aspect may relate to a setup of an electric micro-generator with special thermocells manufactured by means of the silicon wafer technology.

A further aspect may relate to making a fingertip gesture control interface practicable for use by the masses as the process costs may be assumed for a 1×1 mm²-sized thermo-micro-generator, which may amount to less than €1.00, which may be very low compared to the sensor costs and the costs of the complete product.

The aspects and features mentioned and described together with one or more of the previously detailed examples and figures, may as well be combined with one or more of the other examples in order to replace a like feature of the other example or in order to additionally introduce the feature to the other example.

The description and drawings merely illustrate the principles of the disclosure. Furthermore, all examples recited herein are principally intended expressly to be only for pedagogical purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for forming a thermoelectric device, the method comprising:
   forming a plurality of first semiconductor mesa structures at a first semiconductor substrate, the first semiconductor substrate having a first conductivity type;
   forming a plurality of second semiconductor mesa structures at a second semiconductor substrate, the second semiconductor substrate having a second conductivity type;
   arranging a glass substrate between the first semiconductor substrate and the second semiconductor substrate; and
   applying at least one of heat and pressure to the glass substrate to deform the glass substrate so that at least a portion of the glass substrate is moved between first semiconductor mesa structures of the plurality of first semiconductor mesa structures and second semiconductor mesa structures of the plurality of second semiconductor mesa structures, to connect the first semiconductor substrate to the second semiconductor substrate.

2. The method of claim 1, wherein applying heat to the glass substrate comprises a temperature of more than 350° C.

3. The method of claim 2, further comprising heating the first semiconductor substrate, the second semiconductor substrate and the glass substrate to a temperature of more than 350° C. and less than 900° C.

4. The method of claim 1, wherein the glass substrate is a glass wafer or a glass foil comprising at least one of a borosilicate glass, boron-zinc-glass and a low transition temperature glass.

5. The method of claim 1, wherein applying at least one of heat and pressure to the glass substrate comprises pressing the first semiconductor substrate against the second semiconductor substrate with the glass substrate in between and with a pressure force of more than 1 kN and less than 20 kN, to connect the first semiconductor substrate to the second semiconductor substrate.

6. The method of claim 1, wherein forming the plurality of first semiconductor mesa structures comprises forming at least one trench in the first semiconductor substrate, wherein the at least one trench in the first semiconductor substrate is formed by at least one of an etching process, a sawing process, a water jet cutting process, and a laser dicing process.

7. The method of claim 1, further comprising removing a portion of the first semiconductor substrate after the first semiconductor substrate is connected to the second semiconductor substrate, so that the first semiconductor mesa structures of the plurality of first semiconductor mesa structures are separated from each other.

8. The method of claim 1, further comprising forming a plurality of metallization structures located at a side of the first semiconductor mesa structures of the plurality of first semiconductor mesa structures and the second semiconductor mesa structures of the plurality of second semiconductor mesa structures, wherein each metallization structure of the plurality of metallization structures electrically connects a first semiconductor mesa structure of the plurality of first semiconductor mesa structures and a second semiconductor mesa structure of the plurality of second semiconductor mesa structures.

* * * * *